(12) United States Patent
Kaida et al.

(10) Patent No.: US 8,709,317 B2
(45) Date of Patent: Apr. 29, 2014

(54) MOLD FOR NANOIMPRINTING, ITS PRODUCTION PROCESS, AND PROCESSES FOR PRODUCING MOLDED RESIN HAVING FINE CONCAVO-CONVEX STRUCTURE ON ITS SURFACE AND WIRE-GRID POLARIZER

(75) Inventors: Yuriko Kaida, Tokyo (JP); Hiroshi Sakamoto, Tokyo (JP); Takahira Miyagi, Tokyo (JP); Kosuke Takayama, Tokyo (JP); Eiji Shidoji, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/467,010

(22) Filed: May 8, 2012

(65) Prior Publication Data

US 2012/0247950 A1    Oct. 4, 2012

Related U.S. Application Data

(60) Division of application No. 12/960,071, which is a continuation of application No. PCT/JP2009/060289, filed on Jun. 4, 2009.

(30) Foreign Application Priority Data

Jun. 5, 2008    (JP) .................................. 2008-148025

(51) Int. Cl.
*B29C 33/38*    (2006.01)
(52) U.S. Cl.
USPC ......................................... 264/219; 264/1.34
(58) Field of Classification Search
USPC ................... 264/1.34, 219, 319; 977/932, 891
See application file for complete search history.

(56) References Cited

U.S. PATENT DOCUMENTS 7,520,742 B2    4/2009    Motowaki et al.
7,670,127 B2    3/2010    Heidari
(Continued)

FOREIGN PATENT DOCUMENTS

JP    2002-283354    10/2002
JP    2004-288783    10/2004
(Continued)

OTHER PUBLICATIONS

Communication (Supplementary EP Search Report) in EP Appln No. 09758405.6 dated Jun. 14, 2011.
(Continued)

*Primary Examiner* — Yogendra Gupta
*Assistant Examiner* — Robert J Grun
(74) *Attorney, Agent, or Firm* — Foley & Lardner LLP

(57) ABSTRACT

To provide a mold for nanoimprinting capable of accurately transcribing a fine concavo-convex structure, available at a low cost and having high durability, its production process, and processes for producing a molded resin having a fine concavo5 convex structure on its surface having the fine concavo-convex structure of the mold accurately transcribed, and a wire-grid polarizer, with high productivity. A mold 10 for nanoimprinting having on its mold surface a fine concavo-convex structure comprising a plurality of grooves 14 formed in parallel with one another at a constant pitch, which comprises a mold base 12 made of a resin having on its surface a 10 fine concavo-convex structure to be the base of the fine concavo-convex structure, a metal oxide layer 16 covering the surface having the fine concavo-convex structure of the mold base 12, and a release layer 18 covering the surface of the metal oxide layer 16, is used.

15 Claims, 6 Drawing Sheets

(56) References Cited

U.S. PATENT DOCUMENTS

| | | | |
|---|---|---|---|
| 2007/0105055 A1* | 5/2007 | Shirasagi et al. | 430/320 |
| 2008/0061214 A1 | 3/2008 | Lee et al. | |
| 2008/0093776 A1 | 4/2008 | Williams | |
| 2008/0107973 A1 | 5/2008 | Hattori | |
| 2009/0052030 A1 | 2/2009 | Kaida et al. | |

FOREIGN PATENT DOCUMENTS

| | | |
|---|---|---|
| JP | 2007-165812 | 6/2007 |
| JP | 2008-068612 | 3/2008 |
| JP | 2008-074043 | 4/2008 |
| WO | WO-2004/000567 A1 | 12/2003 |
| WO | WO2004000567 * | 12/2003 |
| WO | WO-2007/116972 A1 | 10/2007 |
| WO | WO-2008/149544 A1 | 12/2008 |

OTHER PUBLICATIONS

International Preliminary Examination Report on Patentability mailed Jan. 11, 2011 in International Application No. PCT/JP2009/060289.

International Search Report in PCT/JP2009/060289 dated Aug. 18, 2009.

\* cited by examiner

US 8,709,317 B2

MOLD FOR NANOIMPRINTING, ITS PRODUCTION PROCESS, AND PROCESSES FOR PRODUCING MOLDED RESIN HAVING FINE CONCAVO-CONVEX STRUCTURE ON ITS SURFACE AND WIRE-GRID POLARIZER

TECHNICAL FIELD

The present invention relates to a mold for nanoimprinting, its production process and processes for producing a molded resin having a fine concavo-convex structure on its surface and a wire-grid polarizer, using the mold for nanoimprinting.

BACKGROUND ART

Nanoimprinting technology of using a mold having a fine concavo-convex structure at the nanometer level formed on its surface and transcribing the fine concavo-convex structure onto a resist or a resin has been known. The nanoimprinting technology requires a shorter processing time than an electron beam method, requires low apparatus and material costs required to transcribe the fine concavo-convex structure, and is also excellent in the productivity, and thus attracts attention at present.

As a mold for nanoimprinting, the following has been proposed.

(1) A mold for imprinting covered with a perfluoropolyether having a functional group chemically reactive with the material of the mold (Patent Document 1).

Further, as an apparatus to transcribe the fine concavo-convex structure of the mold, the following has been known.

(2) A nanoimprinting apparatus which heats and pressurizes a substrate and a stamper having a fine concavo-convex structure formed on its surface, to form a fine concavo-convex structure on the substrate, and which has a mechanism to form a release material only on convexes of the stamper (Patent Document 2).

As the material of the mold (1), a metal, a resin, a semiconductor (silicon wafer) and an insulator may, for example, be mentioned. Further, as the material of the stamper (mold) of (2), a silicon wafer, a metal, glass, a ceramic and a plastic may, for example, be mentioned. Among them, in order to accurately transcribe the fine concavo-convex structure at the nanometer level, a silicon wafer must be used as the material of the mold. However, as a silicon wafer has low strength and durability, it can be used only several tens times, and further it is very expensive.

Accordingly, a method has been considered of using a silicon wafer having a fine concavo-convex structure formed on its surface as a master mold, and using a mold having the fine concavo-convex structure of the master mold transcribed to a resin. For example, Patent Document 3 discloses an intermediate stamper having a fine concavo-convex structure of a mold transcribed to a photocurable resin. However, this intermediate stamper is disposable, and there are concerns about its cost and heavy environmental burden.

PRIOR ART DOCUMENTS

Patent Documents

Patent Document 1: JP-A-2002-283354
Patent Document 2: JP-A-2004-288783
Patent Document 3: JP-A-2007-165812

DISCLOSURE OF THE INVENTION

Object to be Accomplished by the Invention

The present invention provides a mold for nanoimprinting capable of accurately transcribing a fine concavo-convex structure, available at a low cost and having high durability, its production process, and processes for producing a molded resin having a fine concavo-convex structure on its surface having the fine concavo-convex structure of the mold for nanoimprinting accurately transcribed, and a wire-grid polarizer, with high productivity.

Means to Accomplish the Object

The mold for nanoimprinting of the present invention is a mold for nanoimprinting having a fine concavo-convex structure on its mold surface, which comprises a mold base made of a resin having on its surface a fine concavo-convex structure to be the base of the fine concavo-convex structure, a metal oxide layer covering the surface having the fine concavo-convex structure of the mold base, and a release layer covering the surface of the metal oxide layer.

The fine concavo-convex structure on the mold surface is preferably a structure having convex stripes or grooves.

The width of the convex stripes or the width of the grooves is preferably from 10 nm to 50 µm on the average.

It is preferred that the thicknesses of the metal oxide layer and the release layer are at least 1 nm, respectively, and the total thickness of them is at most 0.4 time the width of the grooves.

It is preferred that the fine concavo-convex structure on the mold surface comprises a plurality of grooves formed in parallel with one another at a constant pitch, and the pitch of the grooves is from 30 to 300 nm.

The metal oxide layer is preferably a layer containing an oxide of at least one metal selected from the group consisting of Si, Al and Zr.

The release layer is preferably a release layer formed by a compound having a fluoroalkyl group (which may have an etheric oxygen atom).

The mold base is preferably made of a cured product of a photocurable resin composition.

The process for producing a mold for nanoimprinting of the present invention comprises a step of forming a layer of a photocurable resin composition on the surface of a support substrate; a step of overlaying a master mold having a fine concavo-convex structure on its mold surface and the support substrate to sandwich the photocurable resin composition between the mold surface of the master mold and the surface of the support substrate; a step of curing the photocurable resin composition in a state where the photocurable resin composition is sandwiched to form a mold base having on its surface a fine concavo-convex structure reverse of the fine concavo-convex structure on the mold surface; a step of separating the mold base and the master mold; a step of forming a metal oxide layer on the surface having the concavo-convex structure of the mold base; and a step of forming a release layer on the surface of the metal oxide layer.

The method of forming the metal oxide layer is preferably a sputtering method.

The method of forming the release layer is preferably a method of bringing a solution containing a release agent into contact with the surface of the metal oxide layer, and then cleaning the surface of the metal oxide layer with a cleaning liquid, followed by drying.

The process for producing a molded resin having a fine concavo-convex structure on its surface of the present invention comprises a step of forming a layer of a photocurable resin composition on the surface of a support substrate; a step of overlaying the mold for nanoimprinting of the present invention and the support substrate to sandwich the photocurable resin composition between the mold surface having the fine concavo-convex structure and the surface of the support substrate; a step of curing the photocurable resin composition in a state where the photocurable resin composition is sandwiched to form a molded resin having on its surface a fine concavo-convex structure reverse of the fine concavo-convex structure on the mold surface; and a step of separating the molded resin and the mold.

The process for producing a wire-grid polarizer of the present invention comprises a step of forming a layer of a photocurable resin composition on the surface of a support substrate; a step of overlaying the mold for nanoimprinting of the present invention having a fine concavo-convex structure comprising a plurality of grooves formed in parallel with one another at a constant pitch, formed on its mold surface, and the support substrate to sandwich the photocurable resin composition between the mold surface having the grooves and the surface of the support substrate; a step of curing the photocurable resin composition in a state where the photocurable resin composition is sandwiched to form a light-transmitting substrate having a plurality of convex stripes corresponding to the grooves on the mold surface; a step of separating the light-transmitting substrate and the mold; and a step of forming a metal layer on the convex stripes of the light-transmitting substrate.

Effects of the Invention

The mold for nanoimprinting of the present invention is capable of accurately transcribing a fine concavo-convex structure, is available at a low cost and has high durability.

According to the process for producing a mold for nanoimprinting of the present invention, a mold for nanoimprinting capable of accurately transcribing a fine concavo-convex structure, available at a low cost and having high durability can be produced with high productivity.

According to the process for producing a molded resin having a fine concavo-convex structure on its surface, and the process for producing a wire-grid polarizer, of the present invention, a molded resin having the fine concavo-convex structure of the mold accurately transcribed, and a wire-grid polarizer, can be produced at a low cost with high productivity.

BEST MODE FOR CARRYING OUT THE INVENTION

<Mold for Nanoimprinting>

Figure 1:
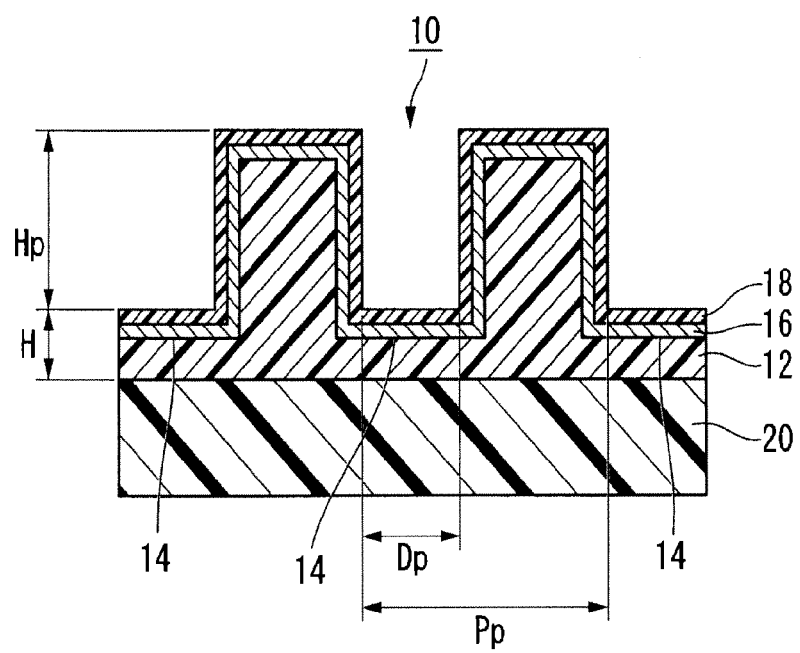
FIG. 1 is a cross-sectional view illustrating one example of a mold for nanoimprinting of the present invention.

FIG. 1 is a cross-sectional view illustrating one example of a mold for nanoimprinting of the present invention. A mold 10 for nanoimprinting is a mold for nanoimprinting having a fine concavo-convex structure on its mold surface, and is a mold to be used for production of a molded resin having a fine concavo-convex structure on its surface and a wire-grid polarizer described hereinafter. The mold 10 for nanoimprinting comprises a mold base 12 made of a resin having on its surface a fine concavo-convex structure to be the base of the fine concavo-convex structure on the mold surface, a metal oxide layer 16 covering the surface of the fine concavo-convex structure of the mold base 12 along the shape of the fine concavo-convex structure, a release layer 18 covering the surface of the metal oxide layer 16, and a support substrate 20 provided on the opposite side of the mold base 12 from a side where the fine concavo-convex structure is formed.

(Fine Concavo-Convex Structure)

The fine concavo-convex structure in the present invention means fine convexes and/or concaves formed on the surface of a material (a mold, a molded product, etc.).

The convexes may, for example, be long convex stripes extending on the surface of the material or protrusions dotted on the surface.

The concaves may, for example, be long grooves extending on the surface of the material or pores dotted on the surface.

The shape of the convex stripes or grooves may, for example, be a linear, curved or bent shape. The convex stripes or the grooves may be in the form of stripes present in parallel with one another.

The cross-sectional shape in a direction perpendicular to the longitudinal direction of the convex stripes or the grooves may, for example, be rectangular, trapezoidal, triangular or semicircular.

The shape of the protrusions or the pores may, for example, be a triangle pole, a square pole, a hexagonal pole, a cylinder, a triangular pyramid, a quadrangular pyramid, a hexagonal pyramid, a conical hemisphere or a polyhedron.

The fine concavo-convex structure on the mold surface of the mold for nanoimprinting of the present invention is a fine concavo-convex structure formed by covering the surface having a fine concavo-convex structure of a mold base with a metal oxide layer and a release layer in this order.

Accordingly, the dimensions of the fine concavo-convex structure on the mold surface of the mold for nanoimprinting of the present invention differ from the dimensions of the fine concavo-convex structure of the mold base by the thicknesses of the metal oxide layer and the release layer. That is, the dimensions of the fine concavo-convex structure of the mold surface of the mold for nanoimprinting of the present invention are dimensions after formation of the metal oxide layer and the release layer.

The following dimensions are dimensions of the fine concavo-convex structure on the mold surface of the mold for nanoimprinting of the present invention.

The width of the convex stripes or the grooves is preferably from 10 nm to 50 μm, more preferably from 15 nm to 30 μm, further preferably from 20 nm to 1 μm, particularly preferably from 40 nm to 500 nm, on the average. The width of the convex stripes means the length of the base in the cross section in a direction perpendicular to the longitudinal direction. The width of the grooves means the length of the upper side in the cross section in a direction perpendicular to the longitudinal direction.

The width of the protrusions or the pores is preferably from 10 nm to 50 μm, more preferably from 15 nm to 30 μm, further preferably from 20 nm to 1 μm, particularly preferably from 40 nm to 500 nm, on the average. The width of the protrusions means the length of the base in the cross section in a direction perpendicular to the longitudinal direction, when the base is slender, and in other cases, means the maximum length at the base of each protrusion. The width of the pores means the length of the upper side in the cross section in a direction perpendicular to the longitudinal direction, when the opening is slender, and in other cases, means the maximum length at the opening of each pore.

The height of the convexes is preferably from 5 nm to 5 μm, more preferably from 10 nm to 1 μm, particularly preferably from 30 to 500 nm, on the average.

The depth of the concaves is preferably from 5 nm to 5 μm, more preferably from 10 nm to 1 μm, particularly preferably from 30 to 500 nm, on the average.

In a region where the fine concavo-convex structure is dense, the distance between the adjacent convexes (or concaves) is preferably from 10 nm to 10 μm, more preferably from 15 nm to 2 μm, particularly preferably from 20 to 500 nm, on the average. The distance between the adjacent convexes means the distance from the terminal end of the base in cross section of a convex to the starting end of the base in cross section of the adjacent convex. The distance between the adjacent concaves means the distance from the terminal end of the upper side in cross section of a concave to the starting end of the upper side in cross section of the adjacent concave.

The minimum dimension of a convex is preferably from 5 nm to 1 μm, more preferably from 20 to 500 nm. The minimum dimension means the minimum dimension among the width, length and height of a convex.

The minimum dimension of a concave is preferably from 5 nm to 1 μm, more preferably from 20 to 500 nm. The minimum dimension means the minimum dimension among the width, length and depth of a concave.

The fine concavo-convex structure in FIG. 1 comprises a plurality of grooves 14 formed in parallel with one another at a constant pitch, corresponding to convex stripes of a wire-grid polarizer described hereinafter.

The pitch Pp of the grooves 14 is the total of the width Dp of a groove 14 and the width of a convex stripe formed between grooves 14. The pitch Pp of the grooves 14 is preferably from 30 to 300 nm, more preferably from 40 to 200 nm. When the pitch Pp is at most 300 nm, a wire-grid polarizer produced by using the mold for nanoimprinting will have a sufficiently high reflectance and high polarization separation ability even in a short wavelength region of about 400 nm. Further, coloring effect due to diffraction can be suppressed. When the pitch Pp is at least 30 nm, the fine concavo-convex structure of the mold for nanoimprinting has sufficient strength, whereby favorable productivity and transcription accuracy will be obtained.

The ratio (Dp/Pp) of the width Dp to the pitch Pp of the grooves 14 is preferably from 0.1 to 0.6, more preferably from 0.4 to 0.55. When Dp/Pp is at least 0.1, a wire-grid polarizer produced by using the mold for nanoimprinting will have sufficiently high polarization separation ability. When Dp/Pp is at most 0.6, coloring of transmitted light due to interference can be suppressed.

The depth Hp of the grooves 14 is preferably from 50 to 500 nm, more preferably from 100 to 300 nm. When Hp is at least 50 nm, selective forming of fine metallic wires on the convex stripes of a wire-grid polarizer produced by using the mold for nanoimprinting will be easy. When Hp is at most 500 nm, the incident angle dependence of the degree of polarization of a wire-grid polarizer produced by using the mold for nanoimprinting will be small.

The minimum height H of the mold 10 for nanoimprinting excluding the support substrate 20 is preferably from 0.5 to 1,000 μm, more preferably from 1 to 40 μm. When H is at least 0.5 μm, the strength of a resin constituting the mold base 12 is high relative to the peel strength at the time of mold release, whereby sufficient transcription durability will be obtained. When H is at most 1,000 μm, cracking derived from the deformation of the mold at the time of mold release will be suppressed, whereby sufficient transcription durability will be obtained. The minimum thickness H is the thickness of the mold 10 for nanoimprinting excluding the support substrate 20 at a portion where the grooves 14 are formed.

(Mold Base)

The resin constituting the mold base is preferably a light-transmitting resin. The "light-transmitting" means that it transmits light.

The resin constituting the mold base may be a cured product of e.g. a thermosetting resin, a thermoplastic resin or a photocurable resin composition, and preferred is a cured product of a photocurable resin composition in view of the productivity and the transcription accuracy.

The thermosetting resin may, for example, be a polyimide (PI), an epoxy resin or a urethane resin.

The thermoplastic resin may, for example, be polypropylene (PP), polyethylene (PE), polyethylene terephthalate (PET), polymethyl methacrylate (PMMA), a cycloolefin polymer (COP), a cycloolefin copolymer (COC), or a transparent fluororesin.

The cured product of a photocurable resin composition is preferably one obtained by curing a photocurable resin composition by photopolymerization, in view of the productivity.

The cured product of a photocurable resin composition is preferably one having an ultraviolet transmittance at a wavelength of 360 nm of at least 92%, more preferably at least 92.5%, at a thickness of 200 μm. When the ultraviolet transmittance is at least 92%, the productivity will be improved when used as a mold.

The ultraviolet transmittance is determined by the ratio (T2×100/T1) of the sample transmitted light T2 to the total quantity of light T1 at 360 nm by using an integration type light transmittance meter.

The tensile strength of the cured product of a photocurable resin composition is preferably at least 30 Pa, more preferably at least 35 Pa. When the tensile strength is at least 30 Pa, the mechanical strength will be high, and sufficient transcription durability will be obtained.

The tensile strength is determined in accordance with JIS K7113.

The contact angle of the cured product of a photocurable resin composition to water is preferably at most 80°, more preferably at most 75°. When the contact angle is at most 80°, the adhesion between the mold base 12 and the metal oxide layer 16 will be favorable.

The contact angle of the cured product of a photocurable resin composition to water is measured in accordance with JIS K6768 by using a contact angle measuring apparatus at a portion of the mold base 12 where no fine concavo-convex structure is formed.

The cured product of a photocurable resin composition satisfying the above characteristics may be one obtained by curing the following photocurable resin composition (A) by photopolymerization.

Photocurable resin composition (A): A photocurable resin composition comprising from 99 to 90 mass % of a photopolymerizable monomer and from 1 to 10 mass % of a photopolymerization initiator, which contains substantially no solvent, and which has a viscosity at 25° C. of from 1 to 2,000 mPa·s.

The photopolymerizable monomer may be a monomer having a polymerizable group, and is preferably a monomer having an acryloyl group or a methacryloyl group, a monomer having a vinyl group, a monomer having an allyl group, a monomer having a cyclic ether group, a monomer having a mercapto group, etc., and is more preferably a monomer having an acryloyl group or a methacryloyl group.

The number of the polymerizable group in the photopolymerizable monomer is preferably from 1 to 6, more preferably 2 or 3, particularly preferably 2. When the monomer has two polymerizable groups, as the polymerization shrinkage is not so significant, favorable transcription accuracy of the fine concavo-convex structure of the master mold will be obtained, and the cured product of a photocurable resin composition will have sufficient strength.

The photopolymerizable monomer is preferably (meth)acrylic acid, a (meth)acrylate, a (meth)acrylamide, a vinyl ether, a vinyl ester, an allyl ether, an allyl ester or a styrene compound, particularly preferably a (meth)acrylate. Here, (meth)acrylic acid generically means acrylic acid and methacrylic acid, the (meth)acrylate generically means an acrylate and a methacrylate, and the (meth)acrylamide generically means an acrylamide and a methacrylamide.

As specific examples of the (meth)acrylate, the following compounds may be mentioned.

A mono(meth)acrylate such as phenoxyethyl (meth)acrylate, benzyl (meth)acrylate, stearyl (meth)acrylate, lauryl (meth)acrylate, 2-ethylhexyl (meth)acrylate, ethoxyethyl (meth)acrylate, methoxyethyl (meth)acrylate, glycidyl (meth)acrylate, tetrahydrofurfuryl (meth)acrylate, allyl (meth)acrylate, 2-hydroxyethyl (meth)acrylate, 2-hydroxypropyl (meth)acrylate, N,N-diethylaminoethyl (meth)acrylate, N,N-dimethylaminoethyl (meth)acrylate, dimethylaminoethyl (meth)acrylate, methyladamantyl (meth)acrylate, ethyladamantyl (meth)acrylate, hydroxyadamantyl (meth)acrylate, adamantyl (meth)acrylate or isobornyl (meth)acrylate.

A di(meth)acrylate such as 1,3-butanediol di(meth)acrylate, 1,4-butanediol di(meth)acrylate, 1,6-hexanediol di(meth)acrylate, diethylene glycol di(meth)acrylate, triethylene glycol di(meth)acrylate, tetraethylene glycol di(meth)acrylate, neopentyl glycol di(meth)acrylate, polyoxyethylene glycol di(meth)acrylate or tripropylene glycol di(meth)acrylate.

A tri(meth)acrylate such as trimethylolpropane tri(meth)acrylate or pentaerythritol tri(meth)acrylate.

A (meth)acrylate having at least four polymerizable groups such as dipentaerythritol hexa(meth)acrylate.

The vinyl ether may, for example, be specifically an alkyl vinyl ether (such as ethyl vinyl ether, propyl vinyl ether, isobutyl vinyl ether, 2-ethylhexyl vinyl ether or cyclohexyl vinyl ether), or a (hydroxyalkyl)vinyl ether (such as 4-hydroxybutyl vinyl ether).

The vinyl ester may, for example, be specifically vinyl acetate, vinyl propionate, vinyl (iso)butyrate, vinyl valerate, vinyl cyclohexanecarboxylate or vinyl benzoate.

The allyl ether may, for example, be specifically an alkyl allyl ether (such as ethyl allyl ether, propyl allyl ether, (iso)butyl allyl ether or cyclohexyl allyl ether).

The allyl ester may, for example, be specifically an alkyl allyl ester (such as ethyl allyl ester, propyl allyl ester or isobutyl allyl ester).

The monomer having a cyclic ether group may be a monomer having a glycidyl group, an oxetanyl group, an oxiranyl group or a spiro ortho ether group.

The monomer having a mercapto group may, for example, be specifically tris-[(3-mercaptopropionyloxy)-ethyl]isocyanurate, trimethylolpropane tris(3-mercaptopropionate), pentaerythritol tetrakis(3-mercaptopropionate) or dipentaerythritol hexa(3-mercaptopropionate).

The number average molecular weight of the photopolymerizable monomer is preferably from 100 to 800, more preferably from 200 to 600.

The photopolymerizable monomers may be used alone or as a mixture of two or more.

The photopolymerizable monomer preferably contains a (meth)acrylate having at least two polymerizable groups, whereby the cured product of the photocurable resin composition (A) has high tensile strength. It may, for example, be specifically 1,3-butanediol diacrylate, 1,4-butanediol diacrylate, 1,6-hexandiol diacrylate, trimethylolpropane triacrylate, pentaerythritol triacrylate, dipentaerythritol hexaacrylate, diethylene glycol diacrylate, neopentyl glycol diacrylate, polyoxyethylene glycol diacrylate or tripropylene glycol diacrylate. Among them, preferred is dipentaerythritol hexaacrylate, neopentyl glycol diacrylate or 1,6-hexanediol diacrylate.

The proportion of the photopolymerizable monomer is from 99 to 90 mass %, preferably from 98 to 91 mass %, particularly preferably from 97 to 92 mass %, in the photocurable resin composition (A) (100 mass %). When the proportion of the photopolymerizable monomer is at most 99 mass %, the photopolymerizable monomer in the photocurable resin composition (A) can easily be polymerized to form a cured product, and no operation such as heating is necessary. When the proportion of the photopolymerizable monomer is at least 90 mass %, the residue of the photopolymerization initiator will be small, and physical properties of the cured product will hardly be impaired.

The photopolymerization initiator is a compound which induces a radical reaction or an ionic reaction by light.

The photopolymerization initiator may be the following photopolymerization initiator.

Acetophenone type photopolymerization initiator: acetophenone, p-(tert-butyl)-1',1',1'-trichloroacetophenone, chloroacetophenone, 2',2'-diethoxyacetophenone, hydroxyacetophenone, 2,2-dimethoxy-2'-phenylacetophenone, 2-aminoacetophenone, dialkylaminoacetophenone, etc.

Benzoin type photopolymerization initiator: benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropan-1-one, 1-(4-isopropylphenyl)-2-hydroxy-2-methylpropan-1-one, benzyl dimethyl ketal, etc.

Benzophenone type photopolymerization initiator: benzophenone, benzoyl benzoic acid, benzoyl methyl benzoate, methyl-o-benzoyl benzoate, 4-phenylbenzophenone, hydroxybenzophenone, hydroxypropylbenzophenone, acrylbenzophenone, 4,4'-bis(dimethylamino)benzophenone, etc.

Thioxanthone type photopolymerization initiator: thioxanthone, 2-chlorothioxanthone, 2-methylthioxanthone, diethylthioxanthone, dimethylthioxanthone, etc.

Photopolymerization initiator containing a fluorine atom: perfluoro(tert-butyl peroxide), perfluorobenzoyl peroxide, etc.

Other photopolymerization initiators: α-acyloxime ester, benzyl-(o-ethoxycarbonyl)-α-monooxime, acylphosphineoxide, glyoxyester, 3-ketocoumarin, 2-ethylanthraquinone, camphorquinone, tetramethylthiuram sulfide, azobisisobutyronitrile, benzoyl peroxide, dialkyl peroxide, tert-butyl peroxypivalate, a boron type iodonium salt, a phosphorous type iodonium salt, a boron type onium salt, a phosphorous type onium salt, etc.

Among them, an acetophenone type, a benzophenone type or a boron type onium salt is preferred as the photopolymerization initiator.

The proportion of the photopolymerization initiator is from 1 to 10 mass %, preferably from 2 to 9 mass %, particularly preferably from 3 to 8 mass % in the photocurable resin composition (A) (100 mass %). When the proportion of the photopolymerization initiator is at least 1 mass %, the photopolymerizable monomer in the photocurable resin composition (A) can easily be polymerized to form a cured product, and no operation such as heating is necessary. When the proportion of the photopolymerization initiator is at most 10 mass %, the residue of the photopolymerization initiator will be small, and physical properties of a cured product will hardly be impaired.

The photocurable resin composition (A) contains substantially no solvent. As it contains no solvent, it can be cured without any other step (e.g. a step of distilling the solvent off) when used. Further, the volume shrinkage of the photocurable resin composition (A) when cured is small. Containing substantially no solvent means no solvent is contained or a solvent used for preparation of the photocurable resin composition (A) is removed as far as possible.

The photocurable resin composition (A) may contain a component (hereinafter referred to as other component) other than the monomer and the photopolymerization initiator. Such other component may, for example, be a surfactant, a photosensitizer, an inorganic material or a carbon material.

The surfactant may, for example, be an anionic surfactant, a cationic surfactant, an amphoteric surfactant or a nonionic surfactant.

The anionic surfactant may, for example, be soap (fatty acid sodium, $RCOO^-Na^+$), a monoalkyl sulfate ($ROSO_3^-M^+$), an alkylpolyoxyethylene sulfate ($RO(CH_2CH_2O)_m SO_3^-M^+$), an alkylbenzene sulfonate ($RR'CH_2CHC_6H_4SO_3^-M^+$) or a monoalkyl phosphate ($ROPO(OH)O^-M^+$).

The cationic surfactant may, for example, be an alkyl trimethyl ammonium salt ($RN^+(CH_3)_3X^-$), a dialkyl dimethyl ammonium salt ($RR'N^+(CH_3)_2X^-$) or an alkyl benzyl dimethyl ammonium salt ($RN^+(CH_2Ph)(CH_3)_2X^-$).

The amphoteric surfactant may, for example, be an alkyl dimethyl amine oxide ($R(CH_3)_2NO$) or an alkyl carboxybetaine ($R(CH_3)_2N^+CH_2COO^-$).

The nonionic surfactant may, for example, be a polyoxyethylene alkyl ether ($RO(CH_2CH_2O)_mH$), fatty acid sorbitan ester, an alkyl polyglucoside, fatty acid diethanolamide ($RCON(CH_2CH_2OH)_2$) or an alkyl monoglyceryl ether ($ROCH_2CH(OH)CH_2OH$).

In the above formulae, R is a $C_{1-22}$ linear or branched alkyl group, R' is a $C_{1-22}$ linear or branched alkyl group, $M^+$ is a monovalent cation of an alkali metal atom, $X^-$ is a monovalent anion of a halogen atom, Ph is a phenyl group, and m is an integer of from 1 to 20.

The photosensitizer may, for example, be specifically n-butylamine, di-n-butylamine, tri-n-butylphosphine, allylthiourea, s-benzylisothiuronium-p-toluene sulfinate, triethylamine, diethylaminoethyl methacrylate, triethylenetetramine or 4,4'-bis(dialkylamino)benzophenone.

The inorganic material may, for example, be specifically a silicon compound (such as silicon, silicon carbide, silicon dioxide, silicon nitride, silicon germanium or iron silicide), a metal (such as platinum, gold, rhodium, nickel, silver, titanium, lanthanide type element, copper, iron or zinc), a metal oxide (such as titanium oxide, alumina, lead oxide, ITO, iron oxide, copper oxide, bismuth oxide, manganese oxide, hafnium oxide, yttrium oxide, tin oxide, cobalt oxide, cerium oxide or silver oxide), an inorganic compound salt (such as a ferrodielectric material such as barium titanate, a piezoelectric material such as lead zirconate titanate, or a battery material such as a lithium salt), or a metal alloy (such as a magnetic material such as a ferrite type magnet or a neodymium type magnet, a semiconductor such as a bismuth-tellurium alloy or a gallium-arsenic alloy, or a fluorescence material such as gallium nitride).

The carbon material may, for example, be specifically fullerene, carbon nanotubes, carbon nanohorns, graphite, diamond or activated carbon.

The proportion of other component is preferably from 0 to 70 mass %, more preferably from 0 to 50 mass % to the photopolymerizable monomer.

The viscosity of the photocurable resin composition (A) at 25° C. is preferably from 1 to 2,000 mPa·s, particularly preferably from 5 to 1,000 mPa·s. When the viscosity is within this range, a smooth coating film can easily be formed by means of e.g. spin coating.

The viscosity is measured at a temperature of 25° C. using a rotational viscometer.

(Metal Oxide Layer)

The metal oxide layer is preferably light-transmitting.

The metal oxide is preferably a compound stable against light, oxygen and heat, preferably ZnO, $SiO_2$, $Al_2O_3$, $ZrO_2$, $SnO_2$ or CaO, more preferably an oxide of at least one metal selected from the group consisting of Si, Al and Zr in view of transcription durability, particularly preferably $SiO_2$, $Al_2O_3$ or $ZrO_2$.

The thickness of the metal oxide layer is preferably from 1 to 10 nm, particularly preferably from 2 to 8 nm on the average. When the thickness of the metal oxide layer is at least 1 nm, the metal oxide layer will be dense, and when used as a mold, the mold base will not be corroded by the photocurable resin composition as a transcription material, whereby the transcription durability will be improved. When the thickness of the metal oxide layer is at most 10 nm, the adhesion between the metal oxide layer and the mold base will be improved, and the transcription durability will be improved.

The thickness of the metal oxide layer is the maximum value of the height of the metal oxide layer formed on the convex stripes formed between the grooves of the mold base.
(Release Layer)

The release layer is formed by a release agent. The release agent preferably contains a compound having a group capable of being chemically bonded to the metal oxide of the metal oxide layer. The chemical bond may be any of the covalent bond, the ionic bond and the coordinate bond, and is preferably the covalent bond. The group capable of being chemically bonded to the metal oxide may be a hydrolysable group containing a silicon atom, a titanium atom or an aluminum atom; or a carboxy group, an acyl group, a hydroxy group, a phosphoric acid group, a phosphono group, a phosphino group, an amino group or a mercapto group, particularly preferably a group represented by the following formula (1):

$$—Si(R^1)_t(R^2)_{3-t} \tag{1}$$

wherein $R^1$ is a hydroxy group or a hydrolysable substituent, $R^2$ is a hydrogen atom or a monovalent hydrocarbon group, and t is an integer of from 1 to 3.

The hydrolysable substituent as $R^1$ may, for example, be a halogen atom, an alkoxy group or an acyloxy group. The halogen atom is preferably a chlorine atom. The alkoxy group is preferably a methoxy group or an ethoxy group, more preferably a methoxy group.

The monovalent hydrocarbon group as $R^2$ may, for example, be an alkyl group, an alkyl group substituted by at least one aryl group, an alkenyl group, an alkynyl group, a cycloalkyl group or an aryl group, and is preferably an alkyl group or an alkenyl group. In a case where $R^2$ is an alkyl group, it is preferably a $C_{1-4}$ alkyl group, more preferably a methyl group or an ethyl group. In a case where $R^2$ is an alkenyl group, it is preferably a $C_{2-4}$ alkenyl group, more preferably a vinyl group or an allyl group.

The release agent preferably contains a compound having a fluoroalkyl group (which may have an etheric oxygen atom), a silicone chain or a $C_{4-24}$ long chain alkyl group, particularly preferably contains a compound having a fluoroalkyl group.

The fluoroalkyl group may, for example, be a perfluoroalkyl group, a polyfluoroalkyl group or a perfluoropolyether group.

The silicone chain may, for example, be dimethyl silicone or methylphenyl silicone.

The $C_{4-24}$ long chain alkyl group may, for example, be a n-hexyl group, a n-heptyl group, a n-octyl group, a n-nonyl group, a n-decyl group, a n-dodecyl group, a lauryl group or an octadecyl group. Such groups may be either linear or branched.

The release agent is preferably a compound represented by the following formula (2):

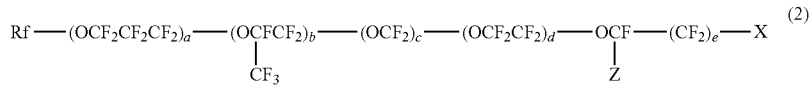

wherein Rf is a perfluoroalkyl group, Z is a fluorine atom or a trifluoromethyl group, each of "a", b, c, d and e is an integer of at least 0, a+b+c+d+e is at least 1, the order of location of the respective repeating units parenthesized with subscripts "a", b, c, d and e is not limited in the formula, and X is a group capable of being chemically bonded to the metal oxide.

X is preferably a group represented by the following formula (3):

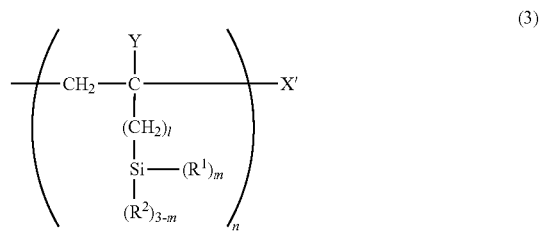

wherein Y is a hydrogen atom or a $C_{1-4}$ alkyl group, X' is a hydrogen atom, a bromine atom or an iodine atom, $R^1$ is a hydroxy group or a hydrolysable substituent, $R^2$ is a hydrogen atom or a monovalent hydrocarbon group, k is an integer of from 0 to 2, m is an integer of from 1 to 3, and n is an integer of at least 1.

The release agent is particularly preferably a compound represented by the following formula (4):

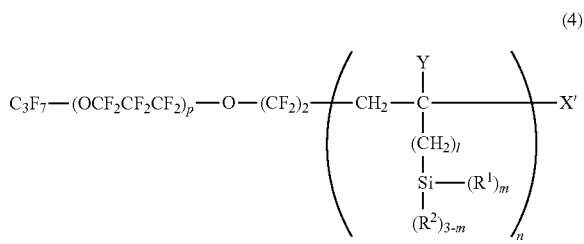

wherein p is an integer of at least 1, and Y, X', $R^1$, $R^2$, k, m and n are as define for the above formula (3).

As commercially available release agents, the following may be mentioned.

Fluorine type release agents: Zonyl TC coat (manufactured by DuPont K.K.), OPTOOL DSX, OPTOOL HD2100 (manufactured by DAIKIN INDUSTRIES LTD.), DURASURF HD-2101Z (manufactured by DAIKIN INDUSTRIES LTD.), CYTOP CTL-107M (manufactured by Asahi Glass Company, Limited), CYTOP CTL-107A (manufactured by Asahi Glass Company, Limited), Novec EGC-1720 (manufactured by Sumitomo 3M Limited), etc.

Organic release agents: A silicone resin (dimethyl silicone oil KF96 (manufactured by Shin-Etsu Silicones), etc.), an alkane resin (SAMLAY forming an alkyl monomolecular film (manufactured by NIPPON SODA CO., LTD.), etc.), etc.

The thickness of the release layer is preferably from 1 to 10 nm, particularly preferably from 2 to 8 nm on the average. When the thickness of the release layer is at least 1 nm, the metal oxide layer will be sufficiently covered with the release layer, thus improving the releasability. When the thickness of the release layer is at most 10 nm, the fine concave-convex structure can be accurately transcribed. The release layer includes a monomolecular film of the release agent.

The thickness of the release layer is the maximum value of the height of the release layer formed on the metal oxide layer formed on the convex stripes formed between the grooves of the mold base.

The thicknesses of the metal oxide layer and the release layer are at least 1 nm, respectively, and the total thickness of them is preferably at most 0.4 time the width of the grooves. It is more preferred that the thicknesses of the metal oxide layer and the release layer are at least 1 nm, respectively, and the total thickness of them is at most 0.3 time the width of the grooves. By the thicknesses of the metal oxide layer and the release layer satisfying such conditions, widths capable of being transcribed are present as grooves, whereby the mold functions.

The contact angle of the release layer to water is preferably at least 90°, more preferably at least 95°. When the contact angle is at least 90°, favorable releasability will be obtained.

The contact angle of the release layer to water is measured in accordance with JIS K6768 by using a contact angle measuring apparatus at a portion of the mold base 12 where no fine concave-convex structure is formed at 25° C.

(Support Substrate)

The support substrate is provided on the opposite side of the mold base from a side where the fine concave-convex structure is formed, as the case requires.

The support substrate is preferably light-transmitting.

As the material of the support substrate, preferred is PET, polycarbonate (PC), polyvinyl chloride (PVC), PMMA, COP, a transparent fluororesin or the like.

The above-described mold for nanoimprinting of the present invention has a metal oxide layer between the mold base and the release layer and thereby has high durability. Further, since the release layer is formed on the surface of the metal oxide layer, the fine concave-convex structure can be accurately transcribed even though the mold base is made of a resin. Further, the mold is available at a low cost since it is made of a resin.

<Process for Producing Mold for Nanoimprinting>

The process for producing the mold for nanoimprinting of the present invention comprises the following steps (i) to (vii).

(i) A step of forming a layer of a photocurable resin composition on the surface of a support substrate.

(ii) A step of overlaying a master mold having a fine concave-convex structure on its mold surface and the support substrate to sandwich the photocurable resin composition between the mold surface of the master mold and the surface of the support substrate.

(iii) A step of curing the photocurable resin composition in a state where the photocurable resin composition is sandwiched to form a mold base having on its surface a fine concave-convex structure reverse of the fine concave-convex structure on the mold surface.

(iv) A step of separating the mold base and the master mold.

(v) A step of forming a metal oxide layer on the surface having the fine concave-convex structure of the mold base.

(vi) A step of forming a release layer on the surface of the metal oxide layer.

(vii) A step of separating the support substrate from the mold base, as the case requires.

Now, the steps (i) to (vii) will be described with reference to FIGS. 2 to 6 taking the mold 10 for nanoimprinting as an example.

(Step (i))

Figure 2:
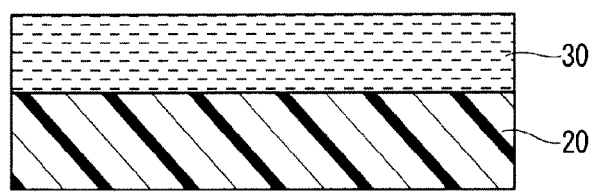
FIG. 2 is a cross-sectional view illustrating one step in a process for producing a mold for nanoimprinting of the present invention.

As shown in FIG. 2, a photocurable resin composition 30 is applied on a support substrate 20 to form a layer of the photocurable resin composition 30 on the surface of the support substrate 20.

The coating method may, for example, be a potting method, a spin coating method, a roll coating method, a die coating method, a spray coating method, a casting method, a dip coating method, screen printing or a transcription method. Among them, a spin coating method, a die coating method or a roll coating method is preferred as the coating method.

The thickness of the coating film of the photocurable resin composition 30 is preferably from 0.5 to 1,000 µm, more preferably from 1 to 40 µm.

(Step (ii))

Figure 3:
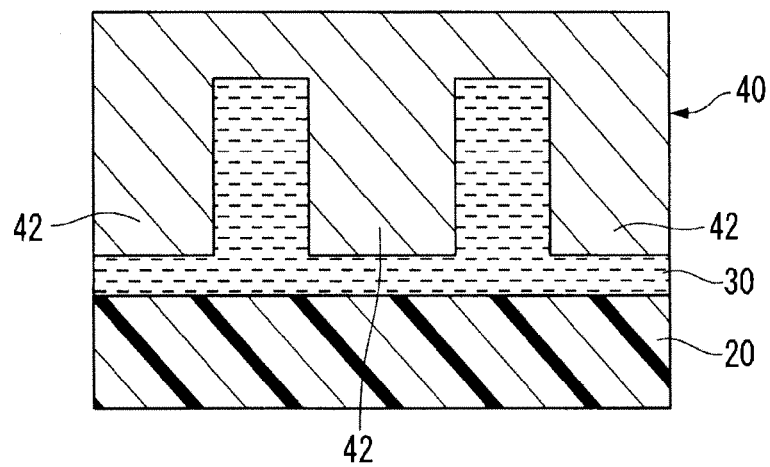
FIG. 3 is a cross-sectional view illustrating one step in a process for producing a mold for nanoimprinting of the present invention.

As shown in FIG. 3, a master mold 40 having on its surface a fine concave-convex structure comprising a plurality of convex stripes 42 is pressed against the photocurable resin composition 30 so that the fine concave-convex structure is in contact with the photocurable resin composition 30, and the master mold 40 and the support substrate 20 are overlaid to sandwich the photocurable resin composition 30 between the mold surface of the master mold 40 and the surface of the support substrate 20.

As the material of the master mold 40, quartz, silicon, nickel or the like is preferred. In a case where the support substrate 20 is not light-transmitting, the material of the master mold 40 is preferably a light-transmitting material such as quartz.

The press pressure (gauge pressure) when the master mold 40 is pressed against the photocurable resin composition 30, is preferably higher than 0 and at most 10 MPa (gauge pressure), more preferably from 0.2 to 9 MPa.

(Step (iii))

Figure 4:
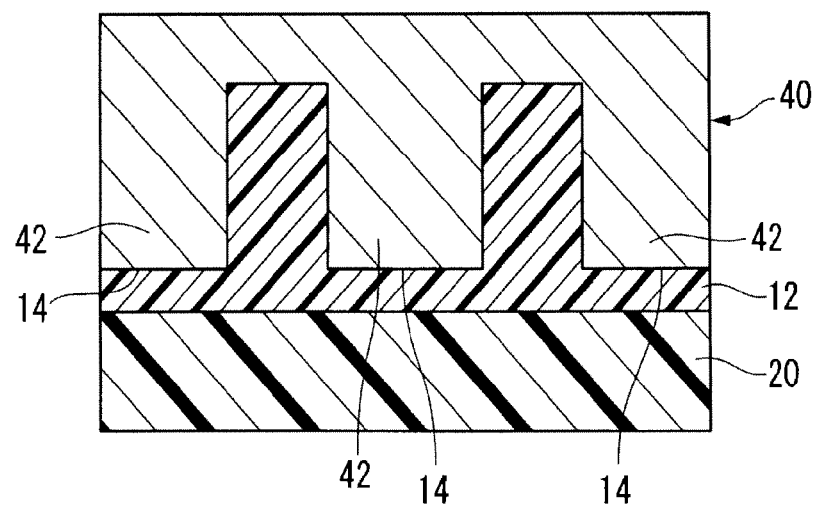
FIG. 4 is a cross-sectional view illustrating one step in a process for producing a mold for nanoimprinting of the present invention.

As shown in FIG. 4, the photocurable resin composition 30 is irradiated with light (such as ultraviolet light) in a state where the photocurable resin composition 30 is sandwiched between the mold surface of the master mold 40 and the surface of the support substrate 20 to cure the photocurable resin composition 30 thereby to form a mold base 12 having on its surface a fine concavo-convex structure (grooves 14) reverse of the fine concavo-convex structure (convex stripes 42) of the master mold 40.

Irradiation of light may be carried out from the support substrate 20 side or the master mold 40 side, in a case where the support substrate 20 and the master mold 40 are light-transmitting. In a case where one of the support substrate 20 and the master mold 40 is light-transmitting and the other is not light-transmitting, it is carried out from the light-transmitting side.

Curing by irradiation with light and curing by heating may be combined.

As a light source for irradiation with light, a high pressure mercury lamp may, for example, be used.

It is preferred to apply from 250 to 1,200 mJ of light having a wavelength of 365 nm, whereby both deep part curing properties and surface curing properties are favorable, and the organic material will not be deteriorated.

(Step (iv))

Figure 5:
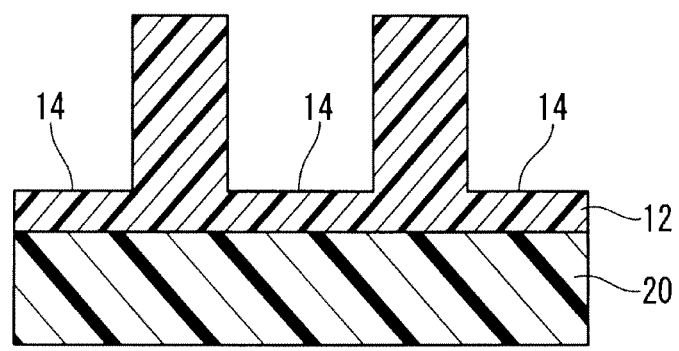
FIG. 5 is a cross-sectional view illustrating one step in a process for producing a mold for nanoimprinting of the present invention.

As shown in FIG. 5, the mold base 12 and the master mold 40 are separated.

(Step (v))

Figure 6:
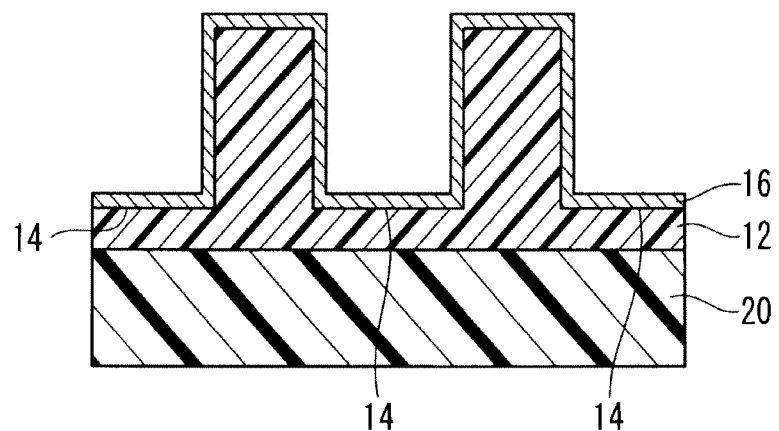
FIG. 6 is a cross-sectional view illustrating one step in a process for producing a mold for nanoimprinting of the present invention.

As shown in FIG. 6, a metal oxide layer 16 is formed on the surface having the fine concavo-convex structure of the mold base 12.

The method of forming the metal oxide layer 16 may, for example, be a vapor deposition method, a sputtering method or a plating method, and is preferably a sputtering method with a view to uniformly forming the metal oxide layer 16.

Further, according to the sputtering method, since the mean free path of particles is short as compared with vapor deposition, the entire complicated fine concavo-convex structure can be covered averagely. Further, by the sputtering method, since the collision energy of particles is high, the film of the metal oxide layer 16 will be dense, and the adhesion between the metal oxide layer 16 and the mold base 12 will be improved, and as a result, transcription durability will be improved.

As the sputtering method, a method of using the metal oxide as a target; or a method (reactive sputtering method) of using a metal as a target, and oxidizing the deposited metal layer by oxygen ion bombardment to obtain a metal oxide layer may be mentioned.

(Step (vi))

The surface of the metal oxide layer 16 is treated with a releasing agent to form a release layer 18 on the surface of the metal oxide layer 16 to obtain a mold 10 for nanoimprinting as shown in FIG. 1.

As a method of treatment with a release agent, a wet coating method or a dry coating method may be mentioned. The wet coating method may, for example, be a spin coating method, a dip coating method or a spray coating method, and is preferably a dip coating method in view of uniformity of the release layer 18.

The dry coating method is preferably a CVD method or a vapor deposition method.

In the wet coating method, the release agent is preferably dissolved or dispersed in a solvent. The solvent is preferably a fluorinated solvent, and may be CT-Solv.100, CT-Solv.180 (manufactured by Asahi Glass Company, Limited); HFE-700 (manufactured by DAIKIN INDUSTRIES LTD.); or Novec HFE (manufactured by Sumitomo 3M Limited).

The concentration of the release agent in the solvent is preferably from 0.001 to 10 mass %, more preferably from 0.01 to 1 mass %. If the concentration is too low, no dense release layer will be formed, whereby the release performance may be decreased. If the concentration is too high, the release layer will not be a monomolecular layer but will be too thick, and the transcription accuracy will be decreased.

The treatment after treatment by the wet coating method or the dry coating method is not particularly limited so long as it is carried out under conditions where the metal oxide film on the mold surface and the functional group in the release agent are reacted to form a chemical bond. The reaction can be accelerated by heating at 60° C. or higher. Further, the reaction can further be accelerated by treatment under high humidity.

As the method of forming the release layer 18, preferred is a method of bringing a solution containing the release agent into contact with the surface of the metal oxide layer, and then cleaning the surface of the metal oxide layer with a cleaning liquid followed by drying.

(Step (vii))

In a case where the minimum thickness H of the mold for nanoimprinting excluding the support substrate 20 is sufficiently thick, the support substrate 20 may be separated from the mold base 12 to obtain a mold for nanoimprinting without the support substrate 20.

The above-described process for producing the mold for nanoimprinting of the present invention is a process comprising the above steps (i) to (vi), that is, a process of forming a mold base by photoimprinting and then forming a metal oxide layer and a release layer in order, and accordingly by this process, a mold for nanoimprinting capable of accurately transcribing a fine concavo-convex structure, available at a low cost having high durability can be produced with high productivity.

<Process for Producing Molded Resin Having Fine Concavo-Convex Structure on its Surface>

The process for producing a molded resin (hereinafter sometimes referred to simply as "a molded resin") having a fine concavo-convex structure on its surface of the present invention comprises the following steps (a) to (d).

(a) A step of forming a layer of a photocurable resin composition on the surface of a support substrate.

(b) A step of overlaying the mold for nanoimprinting of the present invention and the support substrate to sandwich the photocurable resin composition between the mold surface having the fine concavo-convex structure and the surface of the support substrate.

(c) A step of curing the photocurable resin composition in a state where the photocurable resin composition is sandwiched to form a molded resin having on its surface a fine concavo-convex structure reverse of the fine concavo-convex structure on the mold surface.

(d) A step of separating the molded resin and the mold.

The molded resin may, for example, be a light-transmitting substrate of a wire-grid polarizer, a light-transmitting substrate for an optical member such as a prism, a light guide plate or a moth eye, a support substrate for a biosensor, a patterning substrate for a cell culture sheet, a process member for preparation of a member to be used for a semiconductor, and a process member for preparation of a member to be used for a magnetic disk.

Now, the process for producing a molded resin of the present invention will be described in detail with reference to a wire-grid polarizer as an example.

<Wire-Grid Polarizer>

Figure 7:
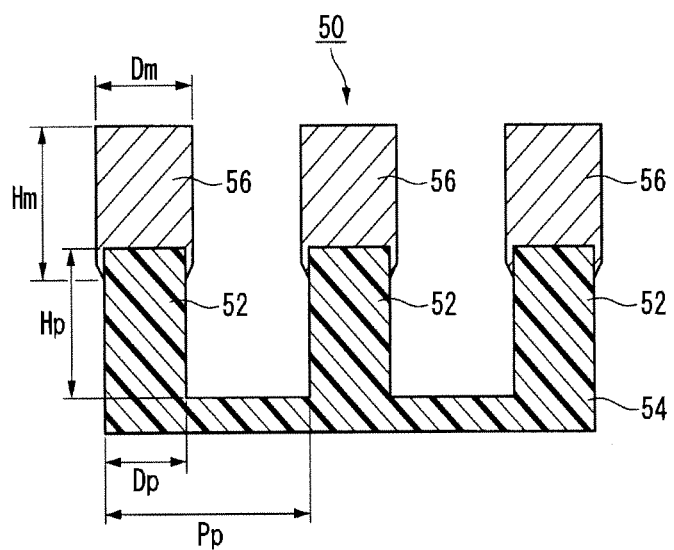
FIG. 7 is a cross-sectional view illustrating one example of a wire-grid polarizer obtained by the production process of the present invention.

FIG. 7 is a cross-sectional view illustrating one example of a wire-grid polarizer obtained by the production process of the present invention. A wire-grid polarizer 50 comprises a light-transmitting substrate 54 made of a cured product of a photocurable resin composition, having on its surface a plurality of convex stripes 52 formed in parallel with one another at a constant pitch Pp, and fine metallic wires 56 formed on the convex stripes 52 on the light-transmitting substrate 54.

(Light-Transmitting Substrate)

The pitch Pp of the convex stripes 52 is the total of a width Dp of a convex stripe 52 and a width of a groove formed between the convex stripes 52. The pitch Pp of the convex stripes 52 is preferably at most 300 nm, more preferably from 40 to 200 nm. When the pitch Pp is at most 300 nm, the wire-grid polarizer 50 will have a sufficiently high reflectance and high polarization separation ability even in a short wavelength region of about 400 nm. Further, coloring effect due to diffraction can be suppressed.

The ratio (Dp/Pp) of the depth Dp to the pitch Pp of the convex stripes 52 is preferably from 0.1 to 0.6, more preferably from 0.4 to 0.55. When Dp/Pp is at least 0.1, the polarization separation ability of the wire-grid polarizer 50 will be sufficiently high. When Dp/Pp is at most 0.6, coloring of transmitted light due to interference can be suppressed.

The height Hp of the convex stripes 52 is preferably from 50 to 500 nm, more preferably from 100 to 300 nm. When the height Hp is at least 50 nm, selective forming of the fine metallic wires 56 on the convex stripes 52 will be easy. When Hp is at most 500 nm, incident angle dependence of the degree of polarization of the wire-grid polarizer 50 will be small.

The light-transmitting substrate is a substrate made of a cured product of a photocurable resin composition.

The photocurable resin composition is preferably a composition containing a photopolymerizable monomer in view of the productivity.

The contact angle of the cured product of the photocurable resin composition to water is preferably at least 90°, more preferably at least 95°. When the contact angle is at least 90°, when the convex stripes 52 are formed by photoimprinting, the releasability from the mold will be good, highly accurate transcription will be possible, and a wire-grid polarizer 50 to be obtained will have sufficient aimed performance.

(Fine Metallic Wire)

The height Hm of the fine metallic wires 56 is preferably from 30 to 300 nm, more preferably from 100 to 150 nm. When the height Hm is at least 30 nm, the wire-grid polarizer 50 will have sufficiently high reflectance and polarization separation ability. When the height Hm is at most 300 nm, light utilization efficiency will be increased.

The ratio (Dm/Dp) of the width Dm of the fine metallic wires 56 to the width Dp of the convex stripes 52 is preferably from 1.0 to 3.0, more preferably from 1.1 to 2.0. When Dm/Dp is at least 1.0, the transmittance of the s-polarized light can be lowered, and the polarization separation ability will be improved. When Dp/Pp is at most 2.0, the high transmittance of the p-polarized light will be obtained.

The width Dm of the fine metallic wires 56 is larger than the width Dp of the convex stripes 52 in many cases. Accordingly, the width Dm of the fine metallic wires 56 is the maximum value of the width of the fine metallic wires 56 formed on the convex stripes 52.

The material of the fine metallic wires is preferably silver, aluminum, chromium or magnesium in view of a high reflectance to visible light, small absorption of visible light and a high electrical conductivity, and it is particularly preferably aluminum.

The cross-sectional shape of the fine metallic wires may be a square, a rectangle, a trapezoid, a circle, an ellipse or other various shapes.

<Process for Producing Wire-Grid Polarizer>

The process for producing a wire-grid polarizer of the present invention comprises the following steps (a) to (f).

(a) A step of forming a layer of photocurable resin composition on the surface of a support substrate.

(b) A step of overlaying the mold for nanoimprinting of the present invention having a fine concavo-convex structure comprising a plurality of grooves formed in parallel with one another at a constant pitch, formed on its mold surface, and the support substrate to sandwich the photocurable resin composition between the mold surface having the grooves and the surface of the support substrate.

(c) A step of curing the photocurable resin composition in a state where the photocurable resin composition is sandwiched to form a light-transmitting substrate having a plurality of convex stripes corresponding to the grooves on the mold surface.

(d) A step of separating the light-transmitting substrate and the mold for nanoimprinting of the present invention.

(e) A step of forming a metal layer on the convex stripes of the light-transmitting substrate.

(f) A step of separating the support substrate from the light-transmitting substrate as the case requires.

Now, the steps (a) to (f) will be described with reference to FIGS. 8 to 12 taking a wire-grid polarizer 50 as an example.

(Step (a))

Figure 8:
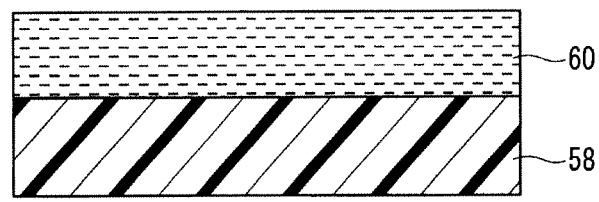
FIG. 8 is a cross-sectional view illustrating one step in a process for producing a wire-grid polarizer of the present invention.

As shown in FIG. 8, a photocurable resin composition 60 is applied on a support substrate 58 to form a layer of the photocurable resin composition 60 on the surface of the support substrate 58.

As the material of the support substrate 58, an inorganic material (such as quartz, glass or a metal) or a resin (such as polydimethylsiloxane or a transparent fluororesin) may, for example, be mentioned.

The coating method may, for example, be a potting method, a spin coating method, a roll coating method, a die coating method, a spray coating method, a casting method, a dip coating method, screen printing or a transcription method. Among them, a spin coating method, a die coating method or a roll coating method is preferred as the coating method.

The thickness of the coating film of the photocurable resin composition 60 is preferably from 0.5 to 1,000 μm, more preferably from 1 to 40 μm.

(Step (b))

Figure 9:
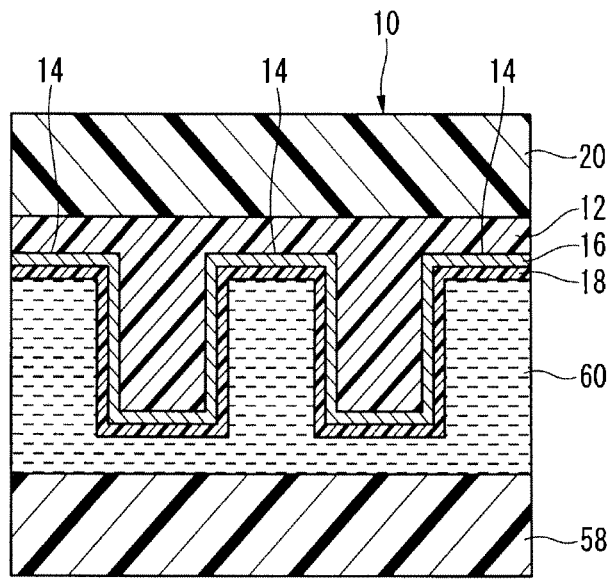
FIG. 9 is a cross-sectional view illustrating one step in a process for producing a wire-grid polarizer of the present invention.

As shown in FIG. 9, a mold 10 for nanoimprinting having a fine concavo-convex structure comprising a plurality of grooves 14 formed in parallel with one another at a constant pitch formed on its surface, is pressed against the photocurable resin composition 60 so that the mold surface having the grooves 14 is in contact with the photocurable resin composition 60, and the mold 10 for nanoimprinting and the support substrate 58 are overlaid to sandwich the photocurable resin composition 60 between the mold surface having the grooves 14 and the surface of the support substrate 58.

The press pressure (gauge pressure) when the mold 10 for nanoimprinting is pressed against the photocurable resin composition 60 is preferably higher than 0 and at most 10 MPa, more preferably from 0.2 to 5 MPa.

When the mold for nanoimprinting is in the form of a roll, it is possible to press the mold while being rotated against the photocurable resin composition and to cure the photocurable resin composition, whereby convex stripes corresponding to the grooves can be continuously transcribed, and thus the obtained wire-grid polarizer can have a large area.

(Step (c))

Figure 10:
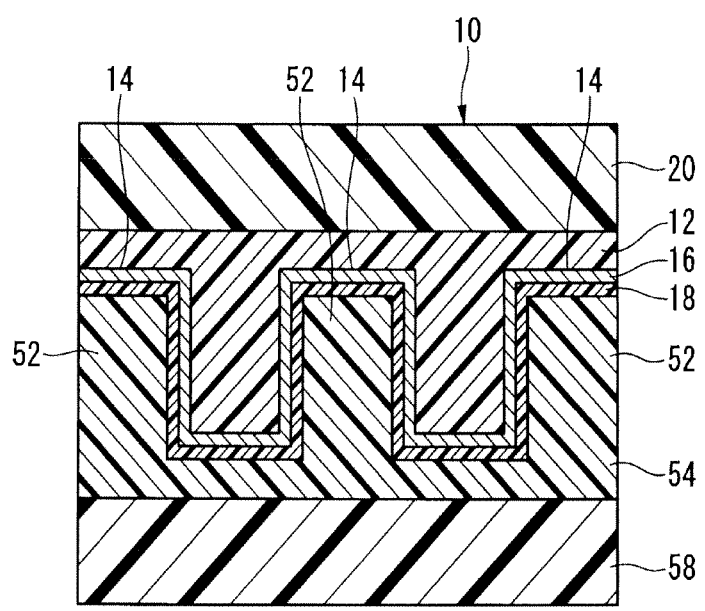
FIG. 10 is a cross-sectional view illustrating one step in a process for producing a wire-grid polarizer of the present invention.

As shown in FIG. 10, the photocurable resin composition 60 is irradiated with light (such as ultraviolet light) in a state where the photocurable resin composition 60 is sandwiched between the mold surface having the grooves 14 and the surface of the support substrate 58 to cure the photocurable resin composition 60 thereby to form a light-transmitting substrate 54 having a plurality of convex stripes 52 corresponding to the grooves 14 on the mold surface.

Irradiation with light may be carried out from the support substrate 58 side or may be carried out from the mold 10 for nanoimprinting side, in a case where the support substrate 58 and the mold 10 for nanoimprinting are light-transmitting. In a case where one of the support substrate 58 and the mold for nanoimprinting is light-transmitting and the other is not light-transmitting, it is carried out from the light-transmitting side.

It is preferred to apply from 250 to 1,200 mJ of light having a wavelength of 365 nm, whereby both deep part curing properties and surface curing properties are favorable, and the organic material will not be deteriorated.

(Step (d))

Figure 11:
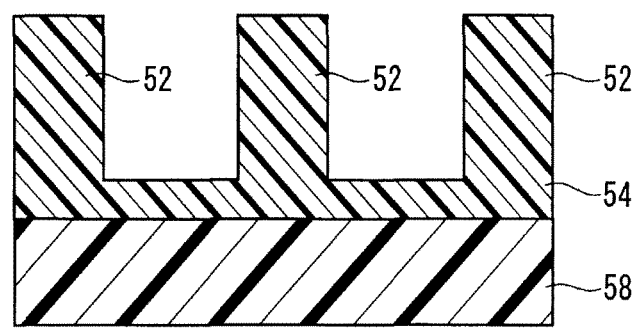
FIG. 11 is a cross-sectional view illustrating one step in a process for producing a wire-grid polarizer of the present invention.

As shown in FIG. 11, the light-transmitting substrate 54 and the mold 10 for nanoimprinting are separated. Further, the step (f) may be carried out prior to the step (d).

(Step (e))

Figure 12:
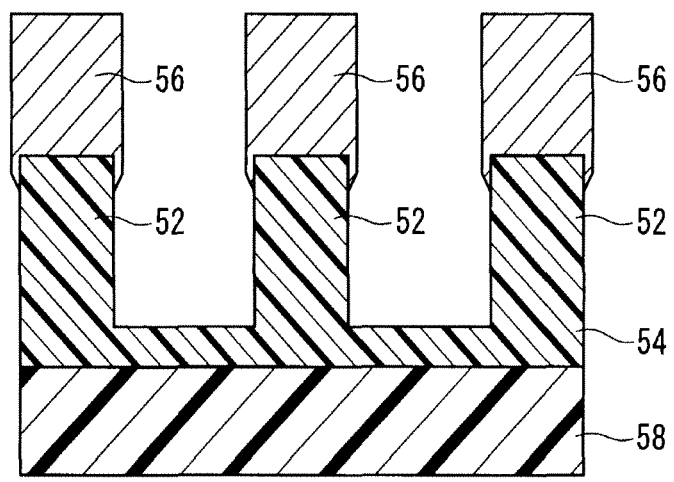
FIG. 12 is a cross-sectional view illustrating one step in a process for producing a wire-grid polarizer of the present invention.

As shown in FIG. 12, fine metallic wires 56 are formed on the convex stripes 52 of the light-transmitting substrate 54. Further, the step (f) may be carried out prior to the step (e).

The method of forming the fine metallic wires 56 may, for example, be a vapor deposition method, a sputtering method or a plating method, and is preferably an oblique vapor deposition method, with a view to selectively forming the fine metallic wires 56 on the convex stripes 52. In a case where the pitch Pp is narrow and the convex stripes 52 are high as in the present invention, a metal layer can be selectively formed on the convex stripes 52 by carrying out oblique vapor deposition at a sufficiently low angle. Further, it is possible to form fine metallic wires having a desired thickness by forming a thin metal layer by an oblique vapor deposition method and then overlaying another metal layer by a plating method.

(Step (f))

The support substrate 58 is separated from the light-transmitting substrate 54 to obtain a wire-grid polarizer 50 as shown in FIG. 7.

In a case where the support substrate 58 is made of a light-transmitting material, an integrated product of the light-transmitting substrate 54 and the support substrate 58 without separation of the support substrate 58 may be used as a wire-grid polarizer.

The above-described process for producing a wire-grid polarizer of the present invention is a process comprising the above steps (a) to (f), that is, photoimprinting technology, and accordingly by the production process, a wire-grid polarizer can be produced with high productivity. Further, since the mold for nanoimprinting of the present invention capable of accurately transcribing a fine concavo-convex structure is used, a wire-grid polarizer having the fine concavo-convex structure of the mold accurately transcribed can be produced. Further, since the mold for nanoimprinting of the present invention having high durability is used, the mold can be repeatedly used and as a result, a wire-grid polarizer can be produced at a low cost.

EXAMPLES

Now, the present invention will be described in further detail with reference to Examples. However, it should be understood that the present invention is by no means restricted to such specific Examples.

Examples 1 to 6 and 9 to 11 are Examples of the present invention, and Examples 7 and 8 are Comparative Examples.

(Ultraviolet Transmittance)

A photocurable resin composition was cured to obtain a cured product having a thickness of 200 μm. With respect to the obtained cured product, the total quantity of light T1 at 360 nm and the sample transmitted light T2 were measured by using an ultraviolet visible spectrophotometer (manufactured by Shimadzu Corporation, Solid-spec 3700) to determine the ratio (T2×100/T1), which is regarded as the ultraviolet transmittance.

(Tensile Strength)

A photocurable resin composition was cured to obtain a cured product of 10 mm×50 mm×100 μm in thickness. The tensile strength of the cured product was measured in accordance with JIS K7113 using a tensile testing apparatus (manufactured by ORIENTEC Co., LTD., RTC-1210).

(Contact Angle)

The contact angle to water was measured in accordance with JIS K6768 by using an automatic contact angle measuring apparatus (manufactured by Kyowa Interface Science Co., Ltd., DM500) at a portion where no fine concavo-convex structure was formed at 25° C.

(Dimensions of Fine Concavo-Convex Structure)

The dimensions of the grooves and the convex stripes were measured by a scanning electron microscope (manufactured by Hitachi, Ltd., S-9000) and a transmission electron microscope (manufactured by Hitachi, Ltd., H-9000) and estimated.

(Thickness)

The thickness of a metal oxide layer was measured by a film thickness monitor comprising a quartz vibrator as a film thickness sensor.

The thickness of a release layer was measured by a transmission electron microscope and ESCA (manufactured by PERKIN ELEMER-PHI, Model 5500).

(Durability I)

The photocurable resin composition 7 was applied by a spin coating method on the surface of a highly transmitting polyethylene terephthalate (PET) film (manufactured by Teijin DuPont Films Japan Limited, Teijin Tetoron O3, 100 mm×100 mm) having a thickness of 100 μm, to form a coating film of the photocurable resin composition 7 having a thickness of 1 μm.

The mold for nanoimprinting was pressed against the coating film of the photocurable resin composition 7 at 25° C. under 0.5 MPa (gauge pressure) so that the grooves were in contact with the coating film of the photocurable resin composition 7.

While this state was maintained, light from a high pressure mercury lamp (frequency: 1.5 kHz to 2.0 kHz, main wavelength light: 255 nm, 315 nm and 365 nm, irradiation energy at 365 nm: 1,000 mJ) was applied from the PET film side for 15 seconds to cure the photocurable resin composition 7 to prepare a light-transmitting substrate having a plurality of convex stripes corresponding to the grooves of the mold for nanoimprinting (pitch Pp of convex stripes: 150 nm, width Dp of convex stripes: 40 nm, height Hp of convex stripes: 200 nm). The mold for nanoimprinting was slowly separated from the light-transmitting substrate.

The above operation as one cycle was repeatedly carried out, and the number of cycles when the mold for nanoimprinting could not be separated from the light-transmitting substrate was regarded as the index of the durability.

(Durability II)

The same operation as for the evaluation of durability I was carried out except that a photocurable resin composition 8 was used instead of the photocurable resin composition 7, and the number of cycles when the mold for nanoimprinting could not be separated from the light-transmitting substrate was regarded as the index of the durability.

(Transmittance)

A solid laser beam having a wavelength of 405 nm and a semiconductor laser beam having a wavelength of 635 nm were guided to the wire-grid polarizer at right angles from the fine metallic wire side of the wire-grid polarizer, and the transmittances of p-polarized light and s-polarized light were measured.

A transmittance of at least 70% was evaluated as ○, and a transmittance less than 70% was evaluated as X.

(Reflectance)

A solid laser beam having a wavelength of 405 nm and a semiconductor laser beam having a wavelength of 635 nm were guided from the surface side of the wire-grid polarizer at an angle of 5° to the surface of the wire-grid polarizer, and the s-polarized light reflectance was measured.

A s-polarized light reflectance at a wavelength of 400 nm or 700 nm of at least 80% was evaluated as ○, and a reflectance less than 80% was evaluated as X.

(Degree of Polarization)

The degree of polarization was calculated from the following formula.

$$\text{Degree of polarization} = ((Tp-Ts)/(Tp+Ts))^{0.5}$$

wherein Tp is the p-polarized light transmittance, and Ts is the s-polarized light transmittance.

A degree of polarization at a wavelength of 400 nm or 700 nm of at least 99.5% was evaluated as ○, and a degree of polarization less than 99.5% was evaluated as X.

(Preparation of Photocurable Resin Composition 1 (for Mold Preparation))

Into a 300 mL four-necked flask equipped with a stirrer and a condenser tube, 60 g of a monomer 1 (manufactured by Shin Nakamura Chemical Co., Ltd., NK Ester, A-DPH, dipentaerythritol hexaacrylate), 40 g of a monomer 2 (manufactured by Shin Nakamura Chemical Co., Ltd., NK Ester, A-NPG, neopentyl glycol diacrylate), 4.0 g of a photopolymerization initiator 1 (manufactured by Ciba Specialty Chemicals, IRGACURE 907) and 1.0 g of a polymerization inhibitor (manufactured by Wako Pure Chemical Industries, Ltd., Q1301) were put.

In a state where the interior in the flask was at room temperature and shaded, the content was stirred and homogenized for one hour to obtain a photocurable resin composition 1 having a viscosity of 100 mPa·s.

The ultraviolet transmittance and the tensile strength of a cured product of the photocurable resin composition 1 were measured. The results are shown in Table 1.

(Preparation of Photocurable Resin Composition 2 (for Mold Preparation))

Into a 300 mL four-necked flask equipped with a stirrer and a condenser tube, 65 g of a monomer 3 (manufactured by Shin Nakamura Chemical Co., Ltd., NK Oligo, EA-1020, bisphenol A type epoxy acrylate), 35 g of a monomer 4 (manufactured by Shin Nakamura Chemical Co., Ltd., NK Ester, 1,6-hexanediol diacrylate, hexane diacrylate), 4.0 g of the photopolymerization initiator 1 and 1.0 g of the polymerization inhibitor 1 were put.

In a state where the interior in the flask was at room temperature and shaded, the content was stirred and homogenized for one hour to obtain a photocurable resin composition 1 having a viscosity of 1,000 mPa·s.

The ultraviolet transmittance and the tensile strength of a cured product of the photocurable resin composition 1 were measured. The results are shown in Table 1.

(Preparation of Photocurable Resin Composition 3 (for Mold Preparation))

Into a 300 mL four-necked flask equipped with a stirrer and a condenser tube, 70 g of a monomer 5 (manufactured by Shin Nakamura Chemical Co., Ltd., NK Ester A-DCP, tricyclodecanedimethanol diacrylate), 30 g of the monomer 2, 4.0 g of the photopolymerization initiator 2 (manufactured by Ciba Specialty Chemicals, IRGACURE 184) and 1.0 g of the polymerization inhibitor 1 were put.

In a state where the interior in the flask was at room temperature and shaded, the content was stirred and homogenized for one hour to obtain a photocurable resin composition 3 having a viscosity of 50 mPa·s.

The ultraviolet transmittance and the tensile strength of a cured product of the photocurable resin composition 3 were measured. The results are shown in Table 1.

(Preparation of Photocurable Resin Composition 4 (for Mold Preparation))

Into a 1,000 mL four-necked flask equipped with a stirrer and a condenser tube, 60 g of the monomer 1, 40 g of the monomer 2, 4.0 of the photopolymerization initiator 1, 1.0 g of the polymerization inhibitor 1 and 65.0 g of cyclohexanone were put.

In a state where the interior in the flask was at room temperature and shaded, the content was stirred and homogenized for one hour. Then, with stirring the content in the flask, 100 g (solid content: 30 g) of colloidal silica was slowly added, and in a state where the interior in the flask was at room temperature and shaded, the content was stirred and homogenized for one hour. Then, 340 g of cyclohexanone was added, and in a state where the interior in the flask was at room temperature and shaded, the content was stirred for one hour to obtain a solution of a photocurable resin composition 4 having a viscosity of 250 mPa·s.

The ultraviolet transmittance and the tensile strength of a cured product of the photocurable resin composition 4 were measured. The results are shown in Table 1.

(Preparation of Photocurable Resin Composition 5 (for Mold Preparation))

Into a 1,000 mL four-necked flask equipped with a stirrer and a condenser tube, 60 g of a monomer 6 (manufactured by TOAGOSEI CO., LTD., OXT-121, xylylene bisoxetane), 40 g of a monomer 7 (manufactured by Japan Epoxy Resins Co., Ltd., EP-801, monoepoxy blend bisphenol A type epoxy resin) and 5.0 g of a photopolymerization initiator 3 (manufactured by Wako Pure Chemical Industries, Ltd., WPI113) were put.

In a state where the interior in the flask was at room temperature and shaded, the content was stirred and homogenized for one hour to obtain a photocurable resin composition 5 having a viscosity of 300 mPa·s.

The ultraviolet transmittance and the tensile strength of a cured product of the photocurable resin composition 5 were measured. The results are shown in Table 1.

(Preparation of Photocurable Resin Composition 6 (for Mold Preparation))

Into a 1,000 mL four-necked flask equipped with a stirrer and a condenser tube, 58 g of a monomer 8 (manufactured by Sakai Chemical Industry Co., Ltd., TMMP, trimethylolpropane tris(3-mercaptopropionate)), 42 g of the monomer 1, 2.0 g of the photopolymerization initiator 1 and 1.0 g of the polymerization inhibitor 1 were put.

In a state where the interior in the flask was at room temperature and shaded, the content was stirred and homogenized for one hour to obtain a photocurable resin composition 6 having a viscosity of 300 mPa·s.

The ultraviolet transmittance and the tensile strength of a cured product of the photocurable resin composition 6 were measured. The results are shown in Table 1.

(Preparation of Photocurable Resin Composition 7 (for Durability Test I))

Into a 1,000 mL four-necked flask equipped with a stirrer and a condenser tube, 60 g of the monomer 1, 40 g of the monomer 2, 4.0 g of the photopolymerization initiator, 0.1 g of a fluorinated surfactant 1 (manufactured by Asahi Glass Company, Limited, a cooligomer of fluoroacrylate ($CH_2$=$CHCOO(CH_2)_2(CF_2)_8F$) and butyl acrylate, fluorine content: about 30 mass %, mass average molecular weight: about 3,000) and 1.0 g of the polymerization inhibitor 1 were put.

In a state where the interior in the flask was at room temperature and shaded, the content was stirred and homogenized for one hour to obtain a solution of a photocurable resin composition 7 having a viscosity of 100 mPa·s.

(Preparation of Photocurable Resin Composition 8 (for Durability Test II))

Into a 1,000 mL four-necked flask equipped with a stirrer and a condenser tube, 60 g of the monomer 1, 40 g of the monomer 2, 4.0 g of the photopolymerization initiator 1 and 1.0 g of the polymerization inhibitor 1 were put.

In a state where the content in the flask was at room temperature and shaded, the content was stirred and homogenized for one hour to obtain a solution of a photocurable resin composition 8 having a viscosity of 100 mPa·s.

(Preparation of Photocurable Resin Composition 9 (for Preparation of Wire-Grid Polarizer))

Into a 1,000 mL four-necked flask equipped with a stirrer and a condenser tube, 60 g of the monomer 1, 40 g of the monomer 2, 4.0 g of the photopolymerization initiator 1, 0.1 g of the fluorinated surfactant 1, 1.0 g of the polymerization inhibitor 1 and 65.0 g of cyclohexanone were put.

In a state where the interior in the flask was at room temperature and shaded, the content was stirred and homogenized for one hour. Then, with stirring the content in the flask, 100 g (solid content: 30 g) of colloidal silica was slowly added, and in a state where the content in the flask was at room temperature and shaded, the content was stirred and homogenized for one hour. Then, 340 g of cyclohexanone was added, and in a state where the interior in the flask was at room temperature and shaded, the content was stirred for one hour, to obtain a solution of a photocurable resin composition 9 having a viscosity of 250 mPa·s.

(Treatment of Master Mold with Release Agent)

As a master mold, a silicon mold having a plurality of convex stripes formed in parallel with one another at a constant pitch (100 mm×100 mm, pitch Pp of convex stripes: 150 nm, width Dp of convex stripes: 50 nm, height Hp of convex stripes: 200 nm, length of convex stripes: 50 nm, cross-sectional shape of convex stripes: rectangular) was prepared.

A fluorinated release agent (manufactured by DAIKIN INDUSTRIES, LTD., OPTOOL DSX) comprising a compound having a group capable of being chemically bonded to a metal oxide was dissolved in a fluorinated solvent (manufactured by Asahi Glass Company, Limited, CT-Solv.100) to prepare a release agent solution 1 (concentration of fluorinated compound: 0.1 mass %).

The silicon mold was dipped in 100 mL of the release agent solution 1, taken out, and immediately rinsed with a fluorinated solvent (manufactured by Asahi Glass Company, Limited, CT-Solv.100) and cured in a thermo-hydrostat at 60° C. under 90% RH for one hour to treat the surface of the silicon mold with a release agent.

Example 1

Preparation of Mold Base

A photocurable resin composition 1 was applied by a spin coating method on the surface of a highly transmitting polyethylene terephthalate (PET) film (manufactured by Teijin DuPont Films Japan Limited, Teijin Tetoron O3, 100 mm×100 mm) having a thickness of 188 μm to form a coating film of the photocurable resin composition 1 having a thickness of 1 μm.

The silicon mold treated with a release agent was pressed against the coating film of the photocurable resin composition 1 at 25° C. under 0.5 MPa (gauge pressure) so that the convex stripes were in contact with the coating film of the photocurable resin composition 1.

While this state was maintained, light from a high pressure mercury lamp (frequency: 1.5 kHz to 2.0 kHz, main wavelength light: 255 nm, 315 nm and 365 nm, irradiation energy at 365 nm: 1,000 mJ) was applied from the PET film side for 15 seconds to cure the photocurable resin composition 1 to prepare a mold base having a plurality of grooves corresponding to the convex stripes of the silicon mold (pitch Pp of grooves: 150 nm, width Dp of grooves 50 nm, depth Hp of grooves: 200 nm). The silicon mold was slowly separated from the mold base.

The contact angle of the mold base to water was measured. The results are shown in Table 1.

Formation of Metal Oxide Layer:

$SiO_2$ as a target was attached to an inline type sputtering apparatus (manufactured by Nisshin Seiki) equipped with a load lock mechanism. The mold base was set in the sputtering apparatus, and $SiO_2$ was deposited from a direction at right angles to the surface where the grooves were formed of the mold base to form a $SiO_2$ layer having a thickness of 5 nm to obtain an intermediate product having a PET film bonded to the rear side of the mold base and a $SiO_2$ layer formed on the front surface.

Formation of Release Layer:

The intermediate product was dipped in 100 mL of the release agent solution 1, taken out and immediately rinsed with a fluorinated solvent (manufactured by Asahi Glass Company, Limited, CT-Solv.100) and cured in a thermo-hydrostat at 60° C. under 90% RH for one hour to form a release layer having a thickness of 2 nm on the surface of the $SiO_2$ layer thereby to obtain a mold 1 for nanoimprinting. The contact angle of the surface of the release layer of the mold 1 for nanoimprinting to water was measured. The results are shown in Table 1.

With respect to the mold 1 for nanoimprinting, the durability I was evaluated. Even after the operation for evaluation of the durability was repeatedly carried out 100 cycles, there was no change in the fine concavo-convex structure on the surface of the light-transmitting substrate comprising the cured product of the photocurable resin composition 7. Further, after the first cycle, the contact angle of the surface of the release layer of the mold 1 for nanoimprinting to water was measured, whereupon it was 93°.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. Further, after the first cycle, the contact angle of the surface of the release layer of the mold 1 for nanoimprinting to water was measured, whereupon it was 93°. The results are shown in Table 1.

Example 2

A mold 2 for nanoimprinting was prepared in the same manner as in Example 1 except that the photocurable resin composition 2 was used instead of the photocurable resin composition 1. The thickness of the $SiO_2$ layer was 5 nm, and the thickness of the release layer was 2 nm. The contact angle of the surface of the release layer of the mold 2 for nanoimprinting to water was measured. The results are shown in Table 1.

With respect to the mold 2 for nanoimprinting, the durability I was evaluated. Even after the operation for evaluation of the durability was repeatedly carried out 100 cycles, there was no change in the fine concavo-convex structure on the surface of the light-transmitting substrate comprising the cured product of the photocurable resin composition 7.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. The results are shown in Table 1.

Example 3

Formation of Metal Oxide Layer

In the same manner as in Example 1 except that $Al_2O_3$ was used as a target of sputtering, an $Al_2O_3$ layer having a thickness of 5 nm was formed to obtain an intermediate product having a PET film bonded to the rear side of the mold base and an $Al_2O_3$ layer formed on the front side.

Formation of Release Layer:

A fluorinated release agent (manufactured by DAIKIN INDUSTRIES LTD., OPTOOL HD2100) comprising a compound having a group capable of being chemically bonded to a metal oxide was dissolved in a fluorinated solvent (manufactured by Asahi Glass Company, Limited, CT-Solv.100) to prepare a release agent solution 2 (concentration of fluorinated compound: 1 mass %).

The intermediate product was dipped in 100 mL of the release agent solution 2, withdrawn and immediately rinsed with a fluorinated solvent (manufactured by Asahi Glass Company, Limited, CT-Solv.100), and cured in a thermohydrostat at 60° C. under 90% RH for one hour to form a release layer having a thickness of 2 nm on the surface of the $Al_2O_3$ layer thereby to obtain a mold 3 for nanoimprinting. The contact angle of the surface of the release layer of the mold 3 for nanoimprinting to water was measured. The results are shown in Table 1.

With respect to the mold 3 for nanoimprinting, the durability I was evaluated. Even after the operation for evaluation of the durability was repeatedly carried out 100 cycles, there was no change in the fine concavo-convex structure on the surface of the light-transmitting substrate comprising the cured product of the photocurable resin composition 7.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. The results are shown in Table 1.

Example 4

A mold 4 for nanoimprinting was prepared in the same manner as in Example 1 except that the photocurable resin composition 3 was used instead of the photocurable resin composition 1. The thickness of the $SiO_2$ layer was 5 nm, and the thickness of the release layer was 2 nm. The contact angle of the surface of the release layer of the mold 4 for nanoimprinting to water was measured. The results are shown in Table 1.

With respect to the mold 4 for nanoimprinting, the durability I was evaluated. Even after the operation for evaluation of the durability was repeatedly carried out 100 cycles, there was no change in the fine concavo-convex structure of the surface of the light-transmitting substrate comprising the cured product of the photocurable resin composition 7.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. The results are shown in Table 1.

Example 5

Formation of Metal Oxide Layer

An intermediate product was prepared in the same manner as in Example 1 except that the photocurable resin composition 4 was used instead of the photocurable resin composition 1. The thickness of the $SiO_2$ layer was 5 nm.

Formation of Release Layer:

A fluorinated release agent (manufactured by DAIKIN INDUSTRIES LTD., OPTOOL DSX) comprising a compound having a group capable of being chemically bonded to a metal oxide was dissolved in a fluorinated solvent (manufactured by Asahi Glass Company, Limited, CT-Solv.100) to prepare a release agent solution 3 (concentration of fluorinated compound: 2 mass %).

Using the release agent solution 3 as a deposition source, the release agent was deposited on the surface of the intermediate product by a vacuum vapor deposition apparatus (manufactured by SHOWA SHINKU CO., LTD., SEC-16CM). The intermediate product was rinsed with a fluorinated solvent (manufactured by Asahi Glass Company, Limited, CT-Solv.100) to form a release layer having a thickness of 1 nm on the surface of $SiO_2$ thereby to obtain a mold 5 for nanoimprinting. The contact angle of the surface of the release layer of the mold 5 for nanoimprinting to water was measured. The results are shown in Table 1.

With respect to the mold 5 for nanoimprinting, the durability I was evaluated. Even after the operation for evaluation of the durability was repeatedly carried out 100 cycles, there was no change in the fine concavo-convex structure on the surface of the light-transmitting substrate comprising the cured product of the photocurable resin composition 7.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. The results are shown in Table 1.

Example 6

In the same manner as in Example 1 except that $ZrO_2$ was used as the target of sputtering, a $ZrO_2$ layer having a thickness of 5 nm was formed to obtain a mold 6 for nanoimprinting having a PET film bonded to the rear side of the mold base, a $ZrO_2$ layer formed on the front surface, and a release layer further formed on the $ZrO_2$ layer. The contact angle of the surface of the release layer of the mold 6 for nanoimprinting to water was measured. The results are shown in Table 1.

With respect to the mold 6 for nanoimprinting, the durability I was evaluated. Even after the operation for evaluation of the durability was repeatedly carried out 100 cycles, there was no change in the fine concavo-convex structure on the surface of the light-transmitting substrate comprising the cured product of the photocurable resin composition 7.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. The results are shown in Table 1.

Example 7

In the same manner as in Example 1, an intermediate product having a PET film bonded to the rear side of the mold base and a $SiO_2$ layer having a thickness of 5 nm formed on the front side, was obtained, which was regarded as a mold 7 for nanoimprinting. The contact angle of the surface of the $SiO_2$ layer of the mold 7 for nanoimprinting to water was measured. The results are shown in Table 1.

With respect to the mold 7 for nanoimprinting, the durability I was evaluated. Even on the first cycle of the operation for evaluation of the durability, the mold 7 for nanoimprinting could not be separated from the light-transmitting substrate comprising the cured product of the photocurable resin composition 7.

Further, the durability II was evaluated. Even on the first cycle of the operation for evaluation of the durability, the mold 7 for nanoimprinting could not be separated from the light-transmitting substrate comprising the cured product of the photocurable resin composition 8. The results are shown in Table 1.

Example 8

In the same manner as in Example 1, a mold base provided with a PET film was prepared. On the mold base, a release layer having a thickness of 2 nm was formed in the same manner as in Example 1 to obtain a mold 8 for nanoimprinting. The contact angle of the surface of the release layer of the mold 8 for nanoimprinting to water was measured. The results are shown in Table 1.

With respect to the mold 8 for nanoimprinting, the durability I was evaluated. On the fifth cycle of the operation for evaluation of the durability, the mold 8 for nanoimprinting could not be separated from the light-transmitting substrate comprising the cured product of the photocurable resin composition 7.

Further, the durability II was evaluated. Even on the first cycle of the operation for evaluation of the durability, the mold 8 for nanoimprinting could not be separated from the light-transmitting substrate comprising the cured product of the photocurable resin composition 8. The results are shown in Table 1.

Example 9

A mold 9 for nanoimprinting was prepared in the same manner as in Example 1 except that the photocurable resin composition 5 was used instead of the photocurable resin composition 1. The thickness of the $SiO_2$ layer was 5 nm, and the thickness of the release layer was 2 nm. The contact angle of the surface of the release layer of the mold 7 for nanoimprinting to water was measured. The results are shown in Table 1.

With respect to the mold 9 for nanoimprinting, the durability I was evaluated. Even after the operation for evaluation of the durability was repeatedly carried out 100 cycles, there was no change in the fine concavo-convex structure on the surface of the light-transmitting substrate comprising the cured product of the photocurable resin composition 7.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. The results are shown in Table 1.

Example 10

A mold 10 for nanoimprinting was prepared in the same manner as in Example 1 except that the photocurable resin composition 6 was used instead of the photocurable resin composition 1. The thickness of the $SiO_2$ layer was 5 nm, and the thickness of the release layer was 2 nm. The contact angle of the surface of the release layer of the mold 10 for nanoimprinting to water was measured. The results are shown in Table 1.

With respect to the mold 10 for nanoimprinting, the durability was evaluated. Even after the operation for evaluation of the durability was repeatedly carried out 100 cycles, there was no change in the fine concavo-convex structure on the surface of the light-transmitting substrate comprising the cured product of the photocurable resin composition 7.

Further, the durability II was evaluated. Even after the operation for evaluation of the durability was repeatedly carried out 100 cycles, there was no change in the fine concavo-convex structure on the surface of the light-transmitting substrate comprising the cured product of the photocurable resin composition 8. The results are shown in Table 1.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Mold base | Photocurable resin composition | 1 | 2 | 1 | 3 | 4 | 1 | 1 | 1 | 5 | 6 |
| | Ultraviolet transmittance (%) | 92.8 | 92.4 | 92.8 | 93.1 | 92.6 | 92.8 | 92.8 | 92.8 | 91.8 | 92.3 |
| | Tensile strength (MPa) | 35 | 54 | 35 | 42 | 68 | 35 | 35 | 35 | 78 | 52 |
| | Contact angle (°) | 70 | 68 | 70 | 72 | 64 | 70 | 70 | 70 | 48 | 54 |
| Metal oxide layer | Type | $SiO_2$ | $SiO_2$ | $Al_2O_3$ | $SiO_2$ | $SiO_2$ | $ZrO_2$ | $SiO_2$ | — | $SiO_2$ | $SiO_2$ |
| | Thickness (nm) | 5 | 5 | 5 | 5 | 5 | 5 | 5 | — | 5 | 5 |
| Release layer | Type | DSX | DSX | HD2100 | DSX | DSX | DSX | — | DSX | DSX | DSX |
| | Treatment method | Dipping | Dipping | Dipping | Dipping | Vapor deposition | Dipping | — | Dipping | Dipping | Dipping |
| | Thickness (nm) | 2 | 2 | 2 | 2 | 1 | 2 | — | 2 | 2 | 2 |
| | Contact angle (°) | 109 | 109 | 105 | 109 | 109 | 109 | 27 | 105 | 109 | 109 |
| Durability I | Number of transcription (cycles) | >100 | >100 | >100 | >100 | >100 | >100 | 1 | 5 | >100 | >100 |
| Durability II | Number of transcription (cycles) | >100 | >100 | >100 | >100 | >100 | >100 | 1 | 1 | >100 | >100 |

DSX: OPTOOL DSX,
HD2100: OPTOOL HD2100

Example 11

Preparation of Light-Transmitting Substrate

The photocurable resin composition 9 was applied by a spin coating method on the surface of a highly transmitting polyethylene terephthalate (PET) film (manufactured by Teijin DuPont Films Japan Limited, Teijin Tetoron O3, 100 mm×100 mm) having a thickness of 100 μm to form a coating film of the photocurable resin composition 9 having a thickness of 1 μm.

The mold 1 for nanoimprinting (100 mm×100 mm, pitch Pp of grooves: 150 nm, width Dp of grooves: 40 nm, depth Hp of grooves: 200 nm, length of grooves: 50 mm, cross-sectional shape of grooves: rectangle) was pressed against the coating film of the photocurable resin composition 9 at 25° C. under 0.5 MPa (gauge pressure) so that the grooves were in contact with the coating film of the photocurable resin composition 9.

While this state was maintained, light from a high pressure mercury lamp (frequency: 1.5 kHz to 2.0 kHz, main wavelength light: 255 nm, 315 nm and 365 nm, irradiation energy at 365 nm: 1,000 mJ) was applied from the mold 1 for nanoimprinting side for 15 seconds to cure the photocurable resin composition 9 thereby to prepare a light-transmitting substrate having a plurality of convex stripes. The mold 1 for nanoimprinting was slowly separated from the light-transmitting substrate.

The above operation was repeatedly carried out three times to obtain three light-transmitting substrates from the single mold 1 for nanoimprinting. Dimensions of convex stripes of the respective light-transmitting substrates (pitch Pp of convex stripes, width Dp of convex stripes, height Hp of convex stripes) are shown in Table 2. Further, the contact angle of the surface of each light-transmitting substrate to water was measured. The results are shown in Table 2.

Formation of Fine Metallic Wire:

Fine metallic wires were formed on the convex stripes of the three light-transmitting substrates by the following method.

Using a vacuum vapor deposition apparatus (manufactured by SHOWA SHINKU CO., LTD., SEC-16CM) capable of changing the gradient of the light-transmitting substrate facing the deposition source, aluminum was deposited on the convex stripes of each light-transmitting substrate by an oblique vapor deposition method to form fine metallic wires (thickness Hm: 50 nm) on the convex stripes of the light-transmitting substrate thereby to obtain a wire-grid polarizer having a PET film bonded to the rear side. The height of aluminum was measured by a film thickness monitor comprising a quartz vibrator as a film thickness sensor. With respect to each of the obtained wire-grid polarizers, the width (Dm) of the fine metallic wires, the transmittance, the reflectance and the degree of polarization were measured. The results are shown in Table 2.

TABLE 2

| | No. 1 | No. 2 | No. 3 |
|---|---|---|---|
| Pp (nm) | 150 | 150 | 150 |
| Dp (nm) | 40 | 40 | 40 |
| Hp (nm) | 200 | 200 | 200 |
| Dm (nm) | 50 | 50 | 50 |
| Contact angle (°) | 93 | 93 | 93 |
| Transmittance | ◯ | ◯ | ◯ |
| Reflectance | ◯ | ◯ | ◯ |
| Degree of polarization | ◯ | ◯ | ◯ |

INDUSTRIAL APPLICABILITY

The mold for nanoimprinting of the present invention is useful for various applications. Specifically, it is useful for production of an optical member such as a prism, a light guide plate or a moth eye, a substrate for biotechnology such as a substrate for a sensing device such as a biosensor or a cell culture sheet, a member for a semiconductor, and a member for a magnetic disk. Further, the mold for nanoimprinting of the present invention is useful also for production of a wire-grid polarizer to be used as a polarizer of an image display device such as a liquid crystal display device, a rear-projection television or a front projector.

The entire disclosure of Japanese Patent Application No. 2008-148025 filed on Jun. 5, 2008 including specification, claims, drawings and summary is incorporated herein by reference in its entirety.

MEANINGS OF SYMBOLS

10: mold for nanoimprinting
12: mold base
14: groove
16: metal oxide layer
18: release layer
20: support substrate
30: photocurable resin composition
40: master mold
42: convex stripe
50: wire-grid polarizer
52: convex stripe
54: light-transmitting substrate
56: fine metallic wire
58: support substrate
60: photocurable resin composition

The invention claimed is:

1. A process for producing a mold for nanoimprinting comprising:
   a step of forming a layer of a photocurable resin composition on the surface of a support substrate;
   a step of overlaying a master mold having a fine concavo-convex structure on its mold surface and the support substrate to sandwich the photocurable resin composition between the mold surface of the master mold and the surface of the support substrate;
   a step of curing the photocurable resin composition in a state where the photocurable resin composition is sandwiched to form a mold base having on its surface a fine concavo-convex structure that is reverse of the fine concavo-convex structure on the master mold surface;
   a step of separating the mold base and the master mold;
   a step of forming a metal oxide layer on the surface having the concavo-convex structure of the mold base; and
   a step of forming a release layer on the surface of the metal oxide layer,
   wherein the method of forming the metal oxide layer is a sputtering method using the metal oxide as a target,
   wherein the mold for nanoimprinting comprises the mold base having on its surface a fine concavo-convex structure, the metal oxide layer on the surface of the fine concavo-convex structure, and the release layer on the surface of the metal oxide layer, and wherein the mold for nanoimprinting is light transmitting.

2. The process for producing a mold for nanoimprinting according to claim 1, wherein the method of forming the release layer is a method of bringing a solution containing a release agent into contact with the surface of the metal oxide layer, and then cleaning the surface of the metal oxide layer with a cleaning liquid, followed by drying.

3. A process for producing a molded resin having a fine concavo-convex structure on its surface, the process comprising:
   a step of forming a layer of a photocurable resin composition on the surface of a support substrate;
   a step of overlaying a mold for nanoimprinting and the support substrate to sandwich the photocurable resin composition between the surface of the mold for nanoimprinting having the fine concavo-convex structure and the surface of the support substrate;
   a step of curing the photocurable resin composition in a state where the photocurable resin composition is sandwiched to form a molded resin having on its surface a fine concavo-convex structure that is reverse of the fine concavo-convex structure on the surface of the mold for nanoimprinting; and
   a step of separating the molded resin and the mold for nanoimprinting;
   wherein the mold for nanoimprinting comprises a mold for nanoimprinting having a fine concavo-convex structure on its mold surface, which comprises
      a mold base made of a resin having on its surface a fine concavo-convex structure to be the base of the fine concavo-convex structure,
      a metal oxide layer covering the surface having the fine concavo-convex structure of the mold base, and
      a release layer covering the surface of the metal oxide layer, and
   wherein the method of forming the metal oxide layer is a sputtering method using the metal oxide as a target, and,
   wherein the mold for nanoimprinting is light transmitting.

4. A process for producing a mold for nanoimprinting, which comprises
   a step of forming a mold base having on its surface a fine concavo-convex structure reverse of the fine concavo-convex structure on the mold surface;
   a step of forming a metal oxide layer on the surface having the concavo-convex structure of the mold base; and
   a step of forming a release layer on the surface of the metal oxide layer;
   wherein the method of forming the metal oxide layer is a sputtering method, and
   wherein the mold is light transmitting.

5. A process for producing an article comprising:
   a step of forming a layer of a photocurable resin composition on the surface of a support substrate;
   a step of overlaying a mold having a fine concavo-convex structure on its mold surface and the support substrate to sandwich the photocurable resin composition between the mold surface of the mold and the surface of the support substrate;
   a step of curing the photocurable resin composition in a state where the photocurable resin composition is sandwiched to form an article base having on its surface a fine concavo-convex structure that is reverse of the fine concavo-convex structure on the mold surface;
   a step of separating the article base and the mold;
   a step of forming a metal oxide layer on the surface having the concavo-convex structure of the article base; and
   a step of forming a release layer on the surface of the metal oxide layer, wherein the method of forming the metal oxide layer is a sputtering method using the metal oxide as a target, and
   wherein the article is light transmitting.

6. A process for producing an article, which comprises
   a step of forming an article base having on its surface a fine concavo-convex structure reverse of the fine concavoconvex structure on the mold surface;
   a step of forming a metal oxide layer on the surface having the concavo-convex structure of the article base; and
   a step of forming a release layer on the surface of the metal oxide layer;
   wherein the method of forming the metal oxide layer is a sputtering method, and wherein the article is light transmitting.

7. The process for producing a mold for nanoimprinting according to claim 1, wherein the fine concavo-convex structure on the mold surface comprises a plurality of grooves, and
   wherein a thickness of the metal oxide layer and a thickness of the release layer are at least 1 nm, respectively, and a total thickness of the metal oxide layer and the release layer is at most 0.4 times a width of the grooves.

8. The process for producing a mold for nanoimprinting according to claim 1, wherein the metal oxide layer is a layer containing an oxide of at least one metal selected from the group consisting of Si, Al and Zr.

9. The process for producing a mold for nanoimprinting according to claim 1, wherein the release layer is a release layer formed by a compound having a fluoroalkyl group or a compound having a fluoroalkyl group having an etheric oxygen atom.

10. The process for producing a molded resin having a fine concavo-convex structure on its surface according to claim 3, wherein the fine concavo-convex structure on the mold surface comprises a plurality of grooves, and
   wherein a thickness of the metal oxide layer and a thickness of the release layer are at least 1 nm, respectively, and a total thickness of the metal oxide layer and the release layer is at most 0.4 times a width of the grooves.

11. The process for producing a molded resin having a fine concavo-convex structure on its surface according to claim 3, wherein the metal oxide layer is a layer containing an oxide of at least one metal selected from the group consisting of Si, Al and Zr.

12. The process for producing a molded resin having a fine concavo-convex structure on its surface according to claim 3, wherein the release layer is a release layer formed by a compound having a fluoroalkyl group or a compound having a fluoroalkyl group having an etheric oxygen atom.

13. The process for producing an article according to claim 5, wherein the fine concavo-convex structure on the mold surface comprises a plurality of grooves, and
   wherein a thickness of the metal oxide layer and a thickness of the release layer are at least 1 nm, respectively, and a total thickness of the metal oxide layer and the release layer is at most 0.4 times a width of the grooves.

14. The process for producing an article according to claim 5, wherein the metal oxide layer is a layer containing an oxide of at least one metal selected from the group consisting of Si, Al and Zr.

15. The process for producing an article according to claim 5, wherein the release layer is a release layer formed by a compound having a fluoroalkyl group or a compound having a fluoroalkyl group having an etheric oxygen atom.

* * * * *